(12) United States Patent
Nagata

(10) Patent No.: US 8,067,316 B2
(45) Date of Patent: Nov. 29, 2011

(54) METHOD FOR MANUFACTURING MEMORY ELEMENT

(75) Inventor: Takaaki Nagata, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 12/485,652

(22) Filed: Jun. 16, 2009

(65) Prior Publication Data

US 2009/0317968 A1 Dec. 24, 2009

(30) Foreign Application Priority Data

Jun. 20, 2008 (JP) ................................ 2008-161257

(51) Int. Cl.
 *H01L 21/31* (2006.01)
(52) U.S. Cl. ........ 438/781; 438/761; 438/763; 438/780; 257/E21.011; 257/E21.299; 257/E21.613
(58) Field of Classification Search .................. 438/768; 257/E21.007, E21.297, E21.299, E21.477, 257/E21.613
See application file for complete search history.

(56) References Cited

U.S. PATENT DOCUMENTS

| | | | | |
|---|---|---|---|---|
| 3,695,870 A | * | 10/1972 | Wakabayashi et al. | ......... 430/31 |
| 3,719,933 A | * | 3/1973 | Wakabayashi et al. | ....... 365/148 |
| 5,583,819 A | | 12/1996 | Roesner et al. | |
| 5,731,598 A | | 3/1998 | Kado et al. | |
| 6,051,851 A | | 4/2000 | Ohmi et al. | |
| 6,534,841 B1 | | 3/2003 | Van Blocklin et al. | |
| 6,584,029 B2 | | 6/2003 | Tran et al. | |
| 2004/0263564 A1 | | 12/2004 | Maekawa et al. | |
| 2005/0095356 A1 | | 5/2005 | Nakamura et al. | |
| 2005/0189520 A1 | | 9/2005 | Okada et al. | |
| 2006/0028895 A1 | | 2/2006 | Taussig et al. | |
| 2006/0046336 A1 | | 3/2006 | Shoji et al. | |
| 2006/0121391 A1 | | 6/2006 | Khang et al. | |
| 2006/0158482 A1 | | 7/2006 | Nakamura et al. | |
| 2006/0210815 A1 | | 9/2006 | Furusawa et al. | |
| 2007/0051952 A1 | | 3/2007 | Yamazaki et al. | |
| 2007/0051958 A1 | | 3/2007 | Yamazaki et al. | |
| 2007/0105285 A1 | * | 5/2007 | Kusumoto et al. | ............ 438/151 |
| 2009/0296318 A1 | * | 12/2009 | Kawahito et al. | ............ 361/540 |

FOREIGN PATENT DOCUMENTS

| | | |
|---|---|---|
| EP | 0 680 087 A2 | 11/1995 |
| EP | 0 750 353 A2 | 12/1996 |
| EP | 1 571 186 A1 | 9/2005 |
| EP | 1 667 244 A2 | 6/2006 |

(Continued)

OTHER PUBLICATIONS

Shimoda. T, "39.1: Invited Paper: Ink-jet Technology for Fabrication Processes of Flat Panel Displays", SID Digest '03: SID International Symposium Digest of Technical Papers, 2003, pp. 1178-1181.

*Primary Examiner* — Cheung Lee
(74) *Attorney, Agent, or Firm* — Husch Blackwell LLP

(57) ABSTRACT

A conductive paste including conductive particles each of which has a size of greater than or equal to 0.1 μm and less than or equal to 10 μm, a resin, and a solvent is placed over a first conductor and the solvent is vaporized. In this manner, a second conductor having the conductive particles and a memory layer including the resin between the first conductor and the conductive particles is formed.

15 Claims, 20 Drawing Sheets

FOREIGN PATENT DOCUMENTS

| | | |
|---|---|---|
| JP | 9-69630 | 3/1997 |
| JP | 2001-015472 | 1/2001 |
| JP | 2001-15472 | 1/2001 |
| JP | 2001-237380 | 8/2001 |
| JP | 2002-26277 | 1/2002 |
| JP | 3501416 | 3/2004 |
| JP | 2005-116682 | 4/2005 |
| JP | 2005-247905 | 9/2005 |
| JP | 2006-165553 | 6/2006 |
| JP | 2006-291347 | 10/2006 |

* cited by examiner

METHOD FOR MANUFACTURING MEMORY ELEMENT

BACKGROUND OF THE INVENTION

1. Field of the Invention

The present invention relates to a memory element, a semiconductor device including the memory element, and a method for manufacturing a memory element.

2. Description of the Related Art

In recent years, semiconductor devices including a memory element have been significantly developed. More inexpensive and convenient semiconductor devices have been required as well as more functional semiconductor devices.

As a type of read only memory (ROM), a memory element to which data can be written by users is given. By using an RFID (radio frequency identification) tag on which a memory device is mounted, merchandise management and cargo management can be easily performed while fraud such as rewriting of data in the memory element is prevented.

As typical examples of such a memory element, a fuse-type memory element, an antifuse-type memory element, and the like are given. As for the fuse-type memory element, the element is burnt off with voltage, whereby data is written, while as for the antifuse-type memory, an insulating portion is made electrically conductive (short-circuited), whereby data is written. When the fuse-type memory element is used, a problem arises in that a high voltage is needed for burning off the element or dust is generated after burning off the element. Therefore, the antifuse-type memory element is developed more actively than the fuse-type memory element. As typical examples of the antifuse-type memory element, an element in which an insulating film such as a silicon oxide film provided between conductors is dielectrically broken down so that the conductors are electrically connected, and the like are given. In addition to the above, an element in which an organic material provided between conductors is dielectrically broken down so that the conductors are electrically connected, an element in which amorphous silicon provided between conductors is silicided so that the conductors are electrically connected, and the like have also been developed (e.g., Patent Document 1). Note that in this specification, a layer which is provided between conductors to electrically connect the conductors by an irreversible reaction, such as the above silicon oxide film, organic material, and amorphous silicon, is also referred to as a "memory layer".

REFERENCE

Patent Document

[Patent Document 1]
Japanese Published Patent Application No. 3501416

SUMMARY OF THE INVENTION

However, an RFID tag mounted with the above memory element has to be disposable because data in the memory element cannot be rewritten. Therefore, the unit price of the RFID tag is high, which disturbs the spread of merchandise and cargo management systems using such an RFID tag.

Thus, an object of an embodiment of the present invention is to easily provide an inexpensive memory element.

Further, reduction in the number of steps for manufacturing a memory element makes it possible to reduce time and effort, which leads to provision of a memory element at low cost. Thus, another object of an embodiment of the present invention is to provide a method for manufacturing a memory element which has a small number of steps.

Moreover, it is preferable that a memory element used for an RFID tag be a low power consumption memory element to and from which data can be written and read at a low voltage. Thus, an object of another embodiment of the present invention is to provide a low power consumption memory element to and from which data can be written and read at a low voltage.

In view of the above objects, the present inventor found that the above objects could be achieved by a method for manufacturing a memory element, in which a conductive paste including conductive particles, a solvent, and a resin is placed over a conductor and the solvent is vaporized.

In other words, an embodiment of the present invention is a method for manufacturing a memory element including the steps of forming a first conductor, placing a conductive paste including conductive particles each of which has a size of greater than or equal to 0.1 μm and less than or equal to 10 μm, a resin, and a solvent, and vaporizing the solvent to form a second conductor having a memory layer.

Another embodiment of the present invention is a method for manufacturing a memory element including the steps of forming a first conductor and a second conductor, placing a conductive paste including conductive particles each of which has a size of greater than or equal to 0.1 μm and less than or equal to 10 μm, a resin, and a solvent so as to fill up a space between the first conductor and the second conductor, and vaporizing the solvent.

Another embodiment of the present invention is a method for manufacturing a memory element including the steps of forming a first conductor, placing a conductive paste including conductive particles each of which has a size of greater than or equal to 0.1 μm and less than or equal to 10 μm, a resin, and a solvent over the first conductor, vaporizing the solvent included in the conductive paste, and forming a second conductor so as to overlap with at least part of a portion where the first conductor is in contact with the conductive paste.

Another embodiment of the present invention in the above structure is a method for manufacturing a memory element, in which the solvent included in the conductive paste is vaporized at a temperature lower than or equal to the upper temperature limit of the resin.

Another embodiment of the present invention in the above structure is a method for manufacturing a memory element, in which the solvent included in the conductive paste is vaporized at a temperature higher than or equal to 10° C. and lower than or equal to 280° C.

Another embodiment of the present invention in the above structure is a method for manufacturing a memory element, in which the solvent included in the conductive paste is vaporized at a temperature higher than or equal to 80° C. and lower than or equal to 240° C.

Another embodiment of the present invention in the above structure is a method for manufacturing a memory element, in which the conductive particles are silver particles.

According to the above method for manufacturing a memory element, the memory layer is formed using the conductive paste, and thus the memory layer can be selectively placed by a droplet discharge method or the like. Accordingly, the number of steps such as photolithography and subsequent etching can be reduced. In addition, in the structure in which the conductive paste obtained after vaporization of the solvent included in the conductive paste functions as both the memory layer and the second conductor, a memory element can be manufactured without separately forming the memory layer and the second conductor, and accordingly the number of manufacturing steps can be further reduced. Moreover, a commercial conductive paste can be used instead of a particular type of material; thus, a memory element can be manufactured inexpensively. Furthermore, since a pattern of the conductive paste is formed by a droplet discharge method, a printing method, or the like, a step such as etching for forming the pattern is not needed. Accordingly, implementation of the present invention makes it possible to easily provide an inexpensive memory element. In addition, the memory element manufactured in the above manner can be a low power consumption memory element to and from which data can be written and read at a low voltage.

Further, an embodiment for achieving the above objects is a memory element manufactured by the above manufacturing method. The specific structure of the memory element is as follows: a first conductor, a second conductor, and a composition which is interposed between and in contact with the first conductor and the second conductor are included; and the composition includes at least conductive particles formed of silver, each of which has a size of greater than or equal to 0.1 μm and less than or equal to 10 μm and an epoxy resin between the first conductor and the conductive particles.

Moreover, another embodiment of the present invention is a memory element including a first conductor and a composition which is provided in contact with the first conductor, where the composition includes at least conductive particles formed of silver, each of which has a size of greater than or equal to 0.1 μm and less than or equal to 10 μm and an epoxy resin between the first conductor and the conductive particles.

The memory element having such a structure can be manufactured through a small number of steps and manufactured inexpensively. Further, the memory element can be a low power consumption memory element to and from which data can be written and read at a low voltage.

Implementation of an embodiment of the present invention makes it possible to easily provide an inexpensive memory element. Further, a semiconductor device mounted with the memory element can be provided easily and inexpensively.

Moreover, implementation of an embodiment of the present invention makes it possible to manufacture a memory element through a small number of steps.

Furthermore, implementation of an embodiment of the present invention makes it possible to provide a low power consumption memory element to and from which data can be written and read at a low voltage.

DETAILED DESCRIPTION OF THE INVENTION

Hereinafter, Embodiments and Examples of the present invention will be described with reference to the accompanying drawings. Note that it is easily understood by those skilled in the art that the present invention can be carried out in many different modes, and the modes and details disclosed herein can be modified in various ways without departing from the spirit and scope of the present invention. Therefore, the present invention should not be construed as being limited to the description below of the embodiment and example.

Embodiment 1

A memory element and a method for manufacturing the memory element will be described with reference to FIGS. 1A to 1C.

Figure 1A:
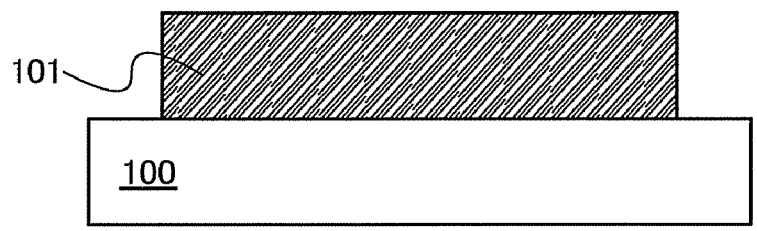
FIGS. 1A to 1C are views illustrating an example of a structure of a memory element and a method for manufacturing the memory element.

First, a first conductor 101 is formed over a substrate 100 (see FIG. 1A).

A substrate formed of any type of material can be used as the substrate 100 as long as the substrate has an insulating property and can hold a manufactured element, like a glass substrate, a plastic substrate, a ceramic substrate, or the like.

As examples of materials with high conductivity which can be used for the first conductor 101, the following can given: metal such as gold, silver, platinum, nickel, tungsten, palladium, aluminum, manganese, titanium, or tantalum; nitride of the above metal (e.g., titanium nitride, tungsten nitride, or molybdenum nitride); alkali metal such as lithium or cesium belonging to Group of the periodic table, or alkali earth metal such as magnesium, calcium, or strontium belonging to Group 2 of the periodic table; an alloy including any of the above alkali metal or the above alkali earth metal (e.g., an alloy of magnesium and silver or an alloy of aluminum and lithium); and the like. Alternatively, rare earth metal such as europium or ytterbium, or an alloy including any of the above rare earth metal may be used. Further alternatively, indium tin oxide (ITO), indium tin oxide containing silicon, or indium oxide containing 2 wt % to 20 wt % zinc oxide which is known as a transparent conductive film, or the like can be used. Further, the first conductor 101 can be formed as a single layer structure or a stacked layer structure using the above material.

Note that there is no particular limitation on a formation method of the first conductor 101. As a formation method of the first conductor 101, for example, a known method such as an evaporation method, a sputtering method, a CVD method, a printing method, an electrolytic plating method, an electroless plating method, or a spin coating method can be used.

Figure 1B:
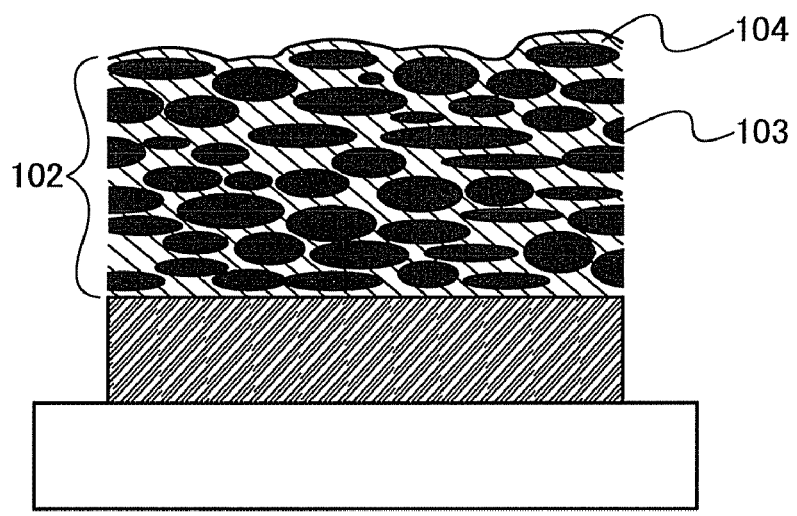

Next, a conductive paste 102 in which conductive particles are dispersed is discharged or printed onto the first conductor 101 by a coating method such as a droplet discharge method or a printing method (see FIG. 1B). As an example of a method of discharging the conductive paste 102, a droplet discharge method is given. The droplet discharge method is a method in which droplets containing a predetermined substance are discharged from pores to form a pattern. Here, the conductive paste 102 in which conductive particles 103 are dispersed in a solvent and a resin 104 is discharged (sprayed). Note that the material to be discharged is also referred to as a "discharge material". A screen printing method or the like can be typically used as a method of printing the conductive paste 102.

For the conductive particles 103, the following can be used: a metal element selected from gold, silver, platinum, nickel, copper, palladium, tantalum, iridium, rhodium, tungsten, aluminum, iron, zinc, tin, titanium, indium, zirconium, barium, and the like; or an alloy material containing the above element as its main component. Alternatively, metal sulfide of cadmium or zinc; oxide of iron, titanium, germanium, silicon, zirconium, barium, or the like; silver halide; or the like may be used. Among the above elements, gold, silver, platinum, or the like is hardly transformed, and thus it can be favorably used. Further, at least the surfaces of the conductive particles 103 are formed using a conductive material, and the inside thereof may be formed using an insulating material. Note that it is preferable that the material of the first conductor 101 be different from that of the conductive particles 103.

There is no particular limitation on the forms of the conductive particles 103 included in the conductive paste 102. The conductive particles 103 can be in, for example, a globular form, a flake form, a rod form, a plate form, or a massive form. Further, the conductive particles 103 with different forms may be mixed. If the size of each of the conductive particles 103 is too small, a problem in dispersion occurs, and if the size thereof is too big, formation of a pattern is obstructed. Therefore, it is preferable that the size of each of the conductive particles 103 be greater than or equal to 0.1 μm and less than or equal to 10 μm. The conductive particles 103 with a variety of sizes may be included as long as the sizes fall within the above range. Note that it is difficult to electrically connect nanoscale particles whose surfaces are covered with an organic material for improving a dispersion property even if the solvent is vaporized by low-temperature baking. Therefore, it is difficult to use the conductive paste including only the nanoscale particles as the conductive particles for forming a second conductor having a memory layer. Note that the present invention is not hindered even if particles each of which has a size of greater than or equal to 1 nm and less than 0.1 μm are supplementarily mixed in addition to the conductive particles 103 with the above size.

Further, the conductive particles 103 may be formed by any of a gas phase method, a liquid phase method, and a solid phase method, and the formation method thereof is not limited.

Water or an organic solvent can be used for the solvent included in the conductive paste 102. Note that the organic solvent may be either a water-soluble organic solvent or a water-insoluble organic solvent. As the water-soluble organic solvent, the following can be given for example: alcohols such as methanol, ethanol, propanol, butyl alcohol, glycerin, dipropylene glycol, and ethylene glycol; ketones such as acetone and methyl ethyl ketone; glycol ether such as ethylene glycol monomethyl ether, ethylene glycol monoethyl ether, ethylene glycol monobutyl ether, and diethylene glycol monobutyl ether, and ester thereof; a water-soluble nitrogen containing organic compound such as 2-pyrrolidone or N-methylpyrrolidone; acetate esters such as ethyl acetate and butylcarbitol acetate; and the like. In addition, as the water-insoluble organic solvent, the following can be given: alkanes such as octane, nonane, and decane; cycloalkane; aromatics such as toluene, xylene, benzene, and dichlorobenzene, and the like. Those solvents are not necessarily used by itself, and plural kinds of solvents may be mixed to be used.

As the resin included in the conductive paste 102, a resin is used which is soluble in the above solvent and can be held on a surface to which the conductive particles are applied after vaporization of the solvent. As such a resin, for example, a phenol resin, an epoxy resin, a polyester resin, a silicone resin, a urea resin, an acrylic resin, a cellulose resin, and the like are given. Note that the resin included in the conductive paste 102 is not limited to the above resins.

In addition to the above, other substances such as a binder or a dispersant may be included in the conductive paste 102. Note that it is preferable that the proportion of the conductive particles 103 in the conductive paste 102 be approximately 80 wt % to 95 wt %.

As described above, the conductive paste 102 is formed of a conductive composition containing the above material.

The above conductive paste 102 may be newly prepared, or a commercial conductive paste can be used. For example, a commercial silver paste in which silver is used for the conductive particles 103 is easily available and inexpensive. Therefore, in the case where the commercial silver paste is used as the conductive paste 102, an inexpensive memory element can be manufactured more easily.

Note that an oxide film may be formed over the first conductor 101 before the conductive paste 102 is discharged or printed. The oxide film includes a natural oxide film in its category. Needless to say, an oxide film formed through an added step such as ozone treatment may be used. However, an oxide film the thickness and film quality of which do not cause sharp increase in writing voltage or reading voltage is formed. For example, in the case where titanium is used for the first conductor 101, a natural oxide film can be favorably used.

Then, the solvent included in the conductive paste 102 formed over the first conductor 101 is vaporized, whereby the conductive particles 103 included in the conductive paste 102 are made to be in contact with each other to improve the conductivity of the conductive paste 102. At this time, the conductive particles 103 formed of the same kind of material are in contact with each other to decrease the resistance value inside the conductive paste 102, so that conductivity high enough for the conductive paste to be used as a conductor can be obtained. However, a layer 105 of a thin resin remains between the first conductor 101 and the conductive particles 103. The layer 105 of the resin which is formed by the above method can be dielectrically broken down by application of voltage. Therefore, the layer 105 of the resin can function as a memory layer. Through the above steps, a second conductor 106 having a memory layer can be formed (see FIG. 1C).

Heating may or may not be performed for vaporization of the solvent. In the case where heating is performed, it is preferably performed at a temperature not exceeding the upper temperature limit of a resin. This is because, if heating is performed at a temperature exceeding the upper temperature limit of a resin, many conductive particles 103 are in contact with the first conductor 101 to generate a short circuit, or the layer 105 of a thick resin is formed between the first conductor 101 and the conductive particles 103 and complete electrical insulation between the first conductor 101 and the conductive particles 103 is generated, which leads to loss of a function as a memory element. Note that the "upper temperature limit" means a highest temperature at which a substance can maintain its property. In other words, heating is performed at a temperature which does not cause swelling, crack, deformation, change in color, loss of transparency, or the like on the resin or the conductive paste 102. In consideration of the above, a step of vaporizing the solvent included in the conductive paste 102 is preferably performed at temperatures ranging from a room temperature to 280° C. Note that when the stability of operation as the memory element is considered, the heating step is preferably performed at temperatures ranging from 80° C. to 240° C. Further, the temperature is measured or set on the basis of not an atmosphere temperature but a substrate temperature.

Data can be written to the memory element manufactured in the above manner when dielectric breakdown is caused by voltage application between the conductors included in the memory element and a short circuit is caused (the resistance value between the conductors is reduced).

Figure 1C:
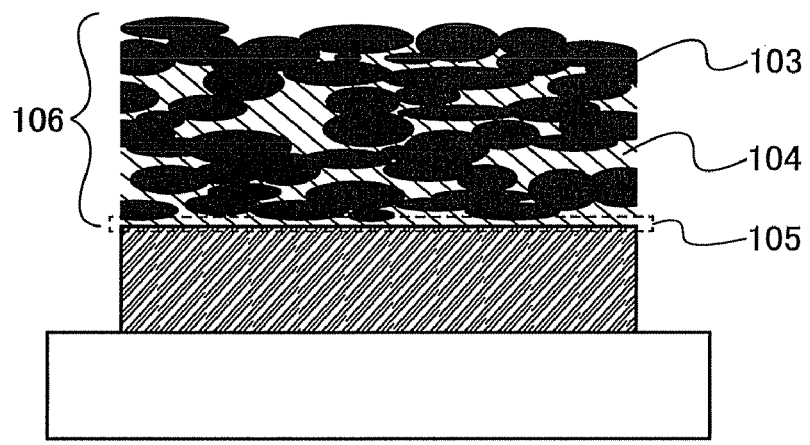
Figure 2:
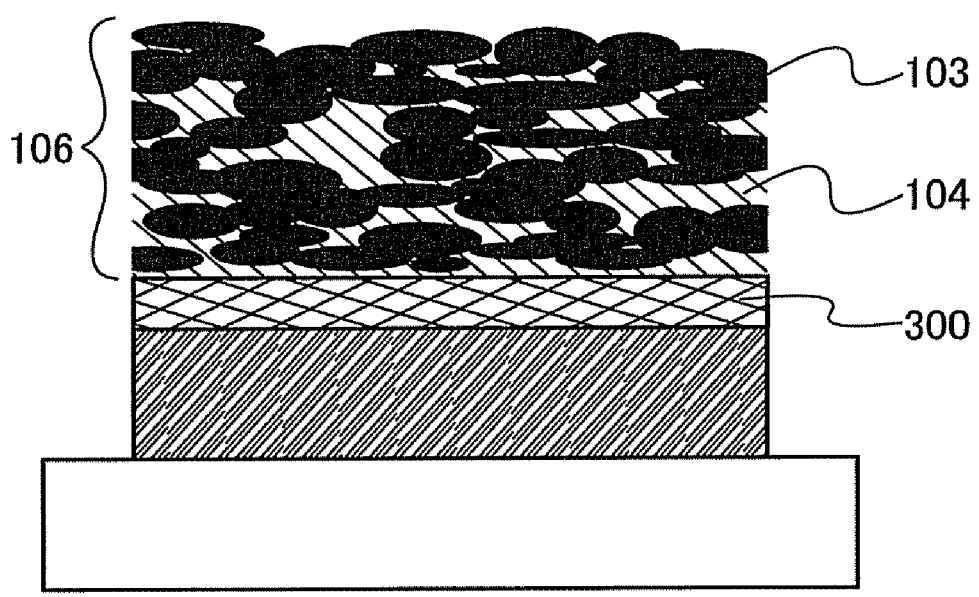
FIG. 2 is a view illustrating an example of a structure of a memory element.

Note that an element structure of the memory element is not limited to the one illustrated in FIGS. 1A to 1C, and a structure illustrated in FIG. 2 may be employed. A memory element having the structure illustrated in FIG. 2 includes the first conductor 101, a layer 300, and the second conductor 106 having a memory layer. The layer 300 is interposed between the first conductor 101 and the second conductor 106 having a memory layer. Note that, although there is no particular limitation on the thickness of the layer 300, the thickness thereof is preferably greater than or equal to 0.1 nm and less than or equal to 50 nm.

The layer 300 is an insulating layer and can be formed using an insulating inorganic compound or an insulating organic compound. As an insulating inorganic compound, the following can be given, for example: oxide such as lithium oxide, sodium oxide, potassium oxide, rubidium oxide, beryllium oxide, magnesium oxide, calcium oxide, strontium oxide, and barium oxide; fluoride such as lithium fluoride, sodium fluoride, potassium fluoride, rubidium fluoride, beryllium fluoride, magnesium fluoride, calcium fluoride, strontium fluoride, and barium fluoride; nitride, chloride, bromide, iodide, carbonate, sulfate, or nitrate with an insulating property; and the like. Further, as an insulating organic compound, the following can be used: polyimide, acrylic, polyamide, benzocyclobutene, polyester, a novolac resin, a melamine resin, an epoxy resin, a silicone resin, a furan resin, a diallyl phthalate resin, or the like. Alternatively, a so-called siloxane based material having a main chain skeleton structure formed by the bond of silicon and oxygen may be used.

An insulating layer is provided as illustrated in FIG. 2, whereby leakage current which flows through an element to which data have not been written when reading voltage is applied can be reduced. Accordingly, power consumed at the time of reading can be reduced.

Note that since the memory layer is thin, data can be written to the memory element of this embodiment at a low voltage. However, leakage current might be increased at the time of reading depending on conditions. In such a case, provision of the layer 300 is especially effective.

The layer 300 can be formed by an evaporation method, a sputtering method, a CVD method, a printing method, a spin coating method, a sol-gel method, a droplet discharge method, or the like. It is particularly preferable to form an insulating organic compound by a solution process such as a printing method, a spin coating method, or a droplet discharge method. In that case, the layer 300 can be formed in such a manner that an insulating organic compound dissolved in the solvent is formed over the first conductor and the solvent is removed. An insulating layer formed through such a solution process has low density and large dimensions. Therefore, such an insulating layer hardly causes increase in writing voltage when being used as the layer 300, in comparison with an insulating layer formed by other methods or using other insulating materials. As a result, leakage current flowing through an element to which data have not been written at the time of reading can be reduced without much increase in writing voltage.

Alternatively, the layer 300 may be a semiconductor layer, and may be formed using an inorganic semiconductor such as molybdenum oxide, tin oxide, bismuth oxide, silicon, vanadium oxide, nickel oxide, zinc oxide, silicon germanium, gallium arsenide, gallium nitride, indium oxide, indium phosphide, indium nitride, cadmium sulfide, cadmium telluride, or strontium titanate.

Such a semiconductor layer can also be formed by a droplet discharge method or a printing method. As another formation method, an evaporation method using resistance heating or an electron beam, a sputtering method, a CVD method, a spin coating method, a sol-gel method, or the like can be used.

As described above, the insulating layer or the semiconductor layer is further provided between the first conductor 101 and the second conductor 106 having a memory layer, whereby leakage current flowing through an element to which data have not been written at the time of reading can be reduced. Accordingly, power consumption can be reduced.

Figure 3:
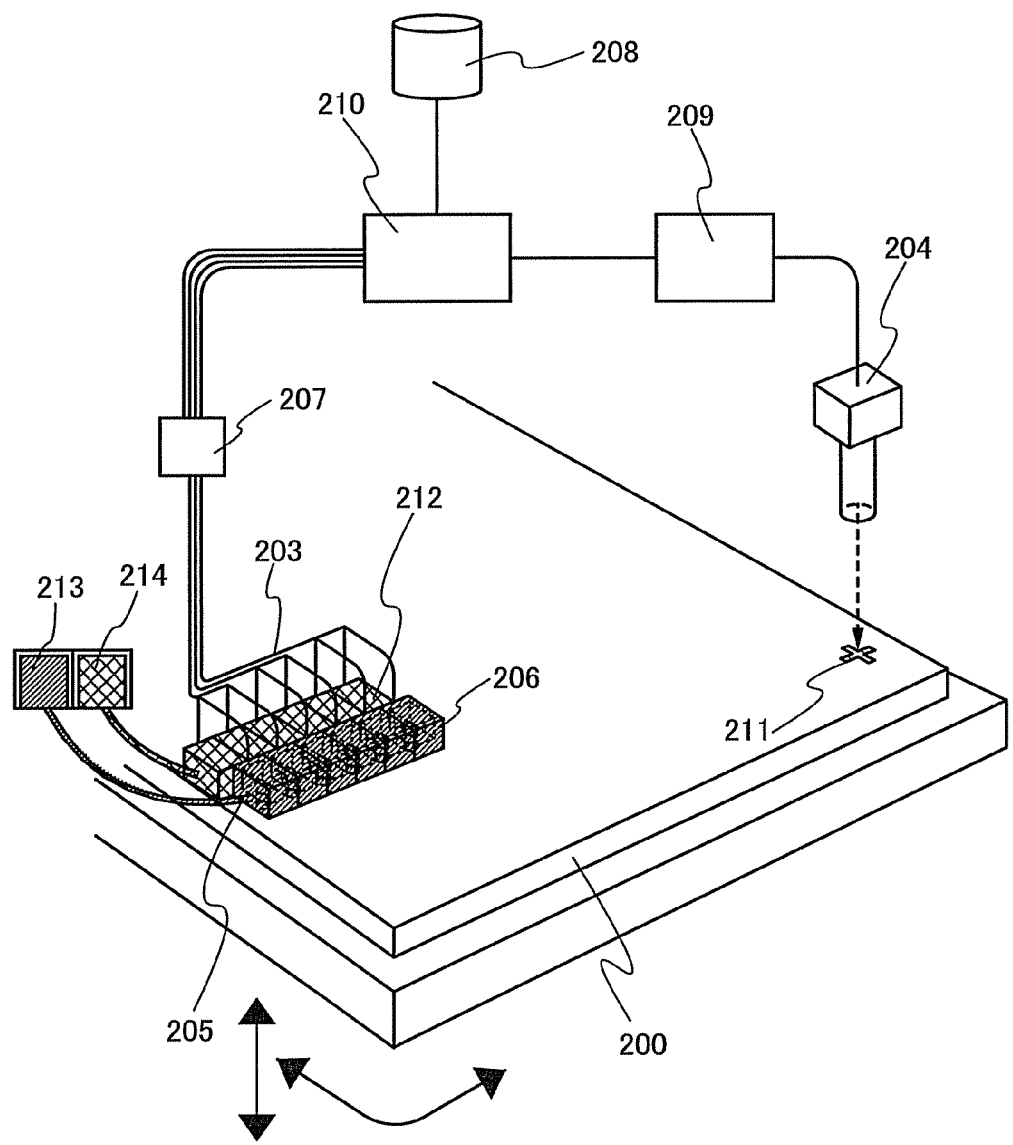
FIG. 3 is a view illustrating a mode of a droplet discharge apparatus.

One mode of a droplet discharge apparatus which is used when the conductive paste is applied is illustrated in FIG. 3. Each of heads 205 and 212 of a droplet discharge means 203 is connected to a control means 207, and the control means 207 is controlled by a computer 210, whereby a preprogrammed pattern can be drawn. The drawing timing may be determined using a marker 211 formed over a substrate 200 over which a memory element is to be provided as a reference, for example. Alternatively, the drawing timing may be determined using the edge of the substrate 200 as a reference. The reference is detected by an imaging means 204 and converted into a digital signal by an image processing means 209. Then, the digital signal is recognized by the computer 210, a control signal is generated, and the control signal is transmitted to the control means 207. An image sensor using a charge coupled device (CCD) or a complementary metal oxide semiconductor (CMOS), or the like can be used as the imaging means 204. Information on a pattern to be formed over the substrate 200 is stored in a storage medium 208. A control signal is transmitted to the control means 207 based on the information, and the heads 205 and 212 of the droplet discharge means 203 are individually controlled. A discharge material is supplied to the head 205 and the head 212 through a material supply source 213 and a material supply source 214, respectively.

Inside the head 205, there are spaces filled with a liquid material as indicated by dotted lines 206 and nozzles which are discharge openings. Although not illustrated in FIG. 3, the head 212 has an internal structure which is similar to that of the head 205. When the heads 205 and 212 have different nozzle sizes from each other, different materials with different widths can be discharged at the same time. Needless to say, the same material can be discharged with different widths at the same time.

In the case of using a large substrate, the heads 205 and 212 can be freely scanned in directions indicated by the arrows in the drawing, and a drawing region can be freely set. Therefore, a plurality of the same patterns can be drawn on one substrate. Further, a drawing region may be freely set by moving a stage. Needless to say, the heads and the stage may be moved simultaneously.

Note that the viscosity of a discharge material is preferably lower than or equal to 20 mPa·s so that the material can be smoothly discharged from the nozzles. The surface tension of the discharge material is preferably lower than or equal to 40 mN/m. Note that, the viscosity of the discharge material, or the like may be adjusted as appropriate in accordance with the solvent used, usage, or the like. Specifically, the viscosity of the discharge material may be set at higher than or equal to 5 mPa·s and lower than or equal to 20 mPa·s.

A discharge material is discharged onto a desired position with use of such a droplet discharge apparatus, and after that, a solvent thereof is vaporized by being dried. Note that the above droplet discharge apparatus is capable of discharging a discharge material onto a desired position, and therefore material use efficiency can be increased.

Here, the example in which the discharge material is discharged onto a desired position of the first conductor 101 by a droplet discharge method is described; however, the formation method of the conductive paste is not limited thereto. For example, when the viscosity of the conductive paste is increased, a variety of types of printing methods such as a screen printing method can be used.

Further, in the above description, the first conductor 101 is formed before the second conductor 106 having a memory layer is formed; however, the second conductor 106 having a memory layer may be formed first using a conductive paste, and then the solvent included in the conductive paste may be vaporized to form the first conductor 101.

The memory element manufactured in the above manner can be manufactured without separately manufacturing a memory layer and the second conductor; therefore, the number of steps can be reduced. The number of steps is reduced, whereby time taken for manufacturing the memory element is shortened and labor cost can be reduced. Further, since a pattern of the conductive paste is formed by a droplet discharge method, a printing method, or the like, a step such as etching for forming the pattern is not needed. A step such as photolithography or etching not only needs time and effort but also consumes a lot of resources. More resources are consumed if the memory layer and the second conductor are separately formed. However, the memory element manufactured by the manufacturing method described in this embodiment is capable of not only forming the memory layer and the second conductor at the same time but also forming them without photolithography or etching. Therefore, consumption of resources, time, and effort can be reduced very effectively and the memory element can be manufactured inexpensively and easily. Furthermore, a commercial conductive paste can be used instead of a particular type of material; thus, a memory element can be manufactured inexpensively. Accordingly, the use of the method described in this embodiment makes it possible to easily provide an inexpensive memory element. Further, the memory element having the above structure can be manufactured through a small number of steps; therefore, it can be an inexpensive memory element.

Further, the memory element can be a low power consumption memory element to and from which data can be written and read at a low voltage.

Note that in the memory element of this embodiment, the memory layer and the second conductor may be separately formed. In that case, the first conductor and the second conductor are first formed over the substrate, and then the conductive paste is placed so as to fill up a space between the first conductor and the second conductor. After that, the solvent included in the placed conductive paste is vaporized. Accordingly, a memory element including the first conductor, the second conductor, and the memory layer formed of the conductive paste, which is separately provided from the first conductor and the second conductor, can be manufactured.

Further, the first conductor is formed over the substrate, the conductive paste is placed so that at least part thereof is in contact with the first conductor, the solvent included in the conductive paste is vaporized, and then the second conductor is formed; accordingly, a memory element including the first conductor, the second conductor, and the memory layer formed of the conductive paste, which is separately provided from the first conductor and the second conductor, can be manufactured.

In those cases, the second conductor may be formed using the same material as the first conductor.

As for the above manufactured memory element including the first conductor, the second conductor, and the memory layer formed of the conductive paste, which is separately provided from the first conductor and the second conductor, the memory layer can be formed of the conductive paste and a pattern of the conductive paste can be formed by a droplet discharge method or a printing method; therefore, the memory element can be formed without photolithography and a subsequent etching for forming the pattern. Therefore, consumption of resources, time, and effort can be reduced and the memory element can be manufactured inexpensively and easily. Furthermore, a commercial conductive paste can be used instead of a particular type of material; thus, a memory element can be manufactured more inexpensively. Accordingly, manufacturing a memory element by the manufacturing method described in this embodiment makes it possible to easily provide an inexpensive memory element. Further, the memory element having the above structure can be manufactured through a small number of steps; therefore, it can be an inexpensive memory element. Further, the memory element can be a low power consumption memory element to and from which data can be written and read at a low voltage.

Embodiment 2

In this embodiment, a semiconductor device including the memory element described in Embodiment 1, typically a memory device, will be described with reference to drawings. Note that a passive matrix memory device will be described in this embodiment.

Figure 4A:
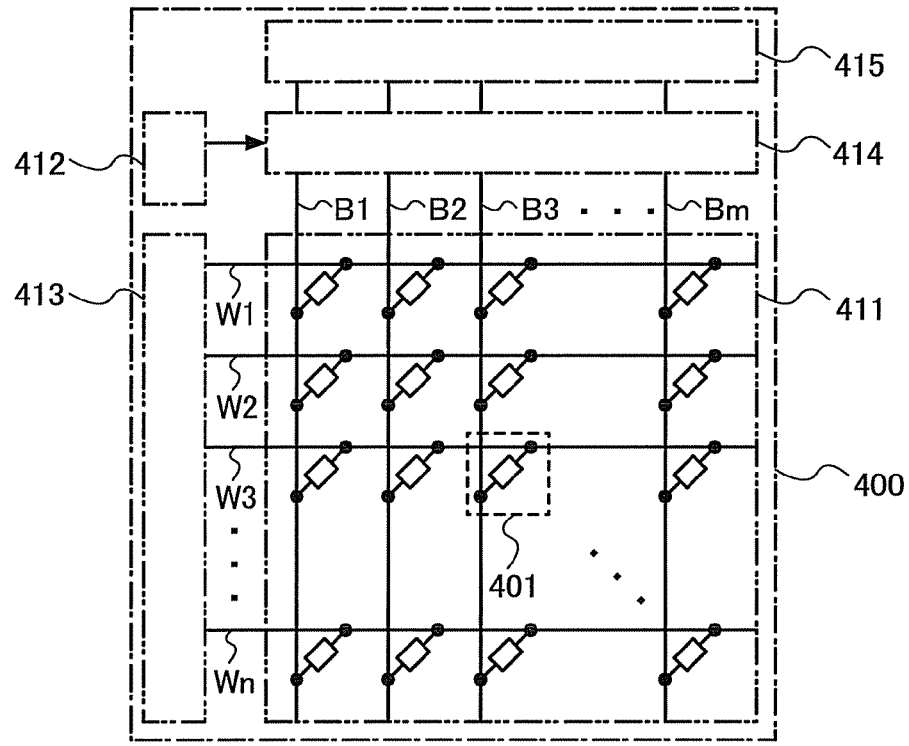
FIGS. 4A to 4C are views illustrating an example of a structure of a semiconductor device.

An example of a structure of a semiconductor device described in this embodiment is illustrated in FIG. 4A. A semiconductor device 400 includes a memory cell array 411 where memory elements 401 are arranged in matrix, decoders 412 and 413, a selector 414, and a read/write circuit 415. The structure of the semiconductor device 400 which is described here is only an example and the semiconductor device 400 may also include other circuits such as a sense amplifier, an output circuit, or a buffer.

Note that the decoders 412 and 413, the selector 414, the read/write circuit 415, an interface, and the like may also be formed over a substrate as with the memory element. Alternatively, they may be attached externally as IC chips.

The memory elements 401 each include a first conductor connected to a word line Wy ($1 \leq y \leq n$) and a second conductor connected to a bit line Bx ($1 \leq x \leq m$). The second conductor also functions as a memory layer at a portion overlapping with the first conductor. Note that a portion where the bit line Bx and the second conductor are electrically connected may be short-circuited by laser bonding or voltage application in advance so that the bit line Bx and the second conductor are surely electrically connected.

Figure 5A:
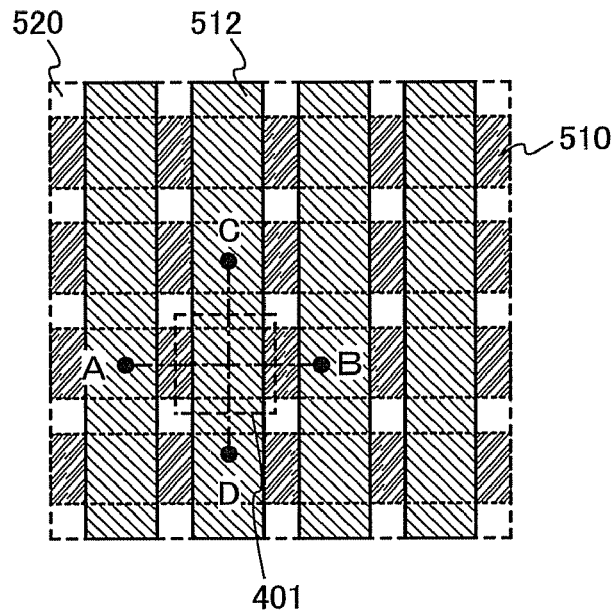
FIGS. 5A to 5C are views illustrating a memory cell included in a semiconductor device.
Figure 5B:
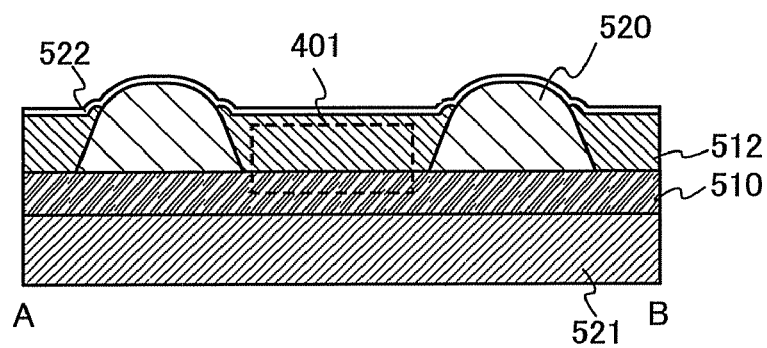
Figure 5C:
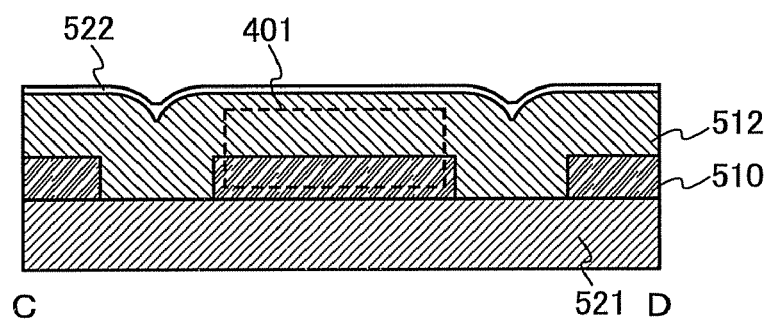

A top view of an example of the memory cell array 411 is illustrated in FIG. 5A and cross-sectional views thereof are illustrated in FIGS. 5B and 5C. Note that FIG. 5A is a top view illustrating part of the memory cell array 411.

In the memory cell array 411, the memory elements 401 are arranged in matrix. The memory elements 401 each include, over a substrate, a first conductor 510 which is extended in a first direction (A-B) and a second conductor 512 having a memory layer, which is extended in a second direction (C-D) perpendicular to the first direction. Note that partition walls (insulating layers) 520 which are extended in the second direction are provided between a plurality of second conductors 512 having a memory layer, and the memory elements adjacent in the first direction (A-B) are separated by the partition walls (insulating layers) 520. Note that layers used for the memory element 401 can be formed using the substance described in Embodiment 1. Further, the second conductor 512 having a memory layer is formed as described in Embodiment 1 so that it can be formed using the same discharge material and through the same steps. Note that, in FIG. 5A, an insulating layer functioning as a protective film provided so as to cover the partition walls (insulating layers) 520 and the second conductor 512 is omitted.

Note that the first conductor 510 in this embodiment corresponds to the first conductor 101 in Embodiment 1, and the second conductor 512 having a memory layer corresponds to the second conductor 106 having a memory layer in Embodiment 1. Further, detailed description on similar portions or portions having similar functions is omitted.

An example of a cross-sectional structure taken along the line A-B in FIG. 5A is illustrated in FIG. 5B. An example of a cross-sectional structure taken along the line C-D in FIG. 5A is illustrated in FIG. 5C. As for a substrate 521 over which the memory element 401 is provided, a quartz substrate, a silicon substrate, a metal substrate, a stainless steel substrate, paper made of a fiber material, or the like can be used in addition to a glass substrate or a flexible substrate. A flexible substrate means a substrate which can be bent. As examples of a flexible substrate, plastic substrates made of polycarbonate, polyarylate, polyethersulfone, and the like can be given. In addition, a film (a film made of polypropylene, polyester, vinyl, polyvinyl fluoride, polyvinyl chloride, or the like) can also be used.

Further, a thin film transistor (TFT) may be provided over an insulating substrate and the memory elements 401 may be provided thereover. Instead of the above substrate, a semiconductor substrate such as a silicon substrate or an SOI (silicon on insulator) substrate may be used to manufacture a field-effect transistor (FET), and the memory elements 401 may be provided thereover. Alternatively, the memory elements 401 may be provided by being attached to the thin film transistor or the field effect transistor. In that case, the memory elements and the thin film transistor or the field-effect transistor are manufactured through different processes, and then the thin film transistor or the field-effect transistor are provided by being attached to the memory element with use of a conductive film, an anisotropic conductive adhesive agent, or the like.

In FIGS. 5B and 5C, first, the first conductor 510 is formed over the substrate 521 by an evaporation method, a sputtering method, a CVD method, a printing method, an electrolytic plating method, an electroless plating method, a droplet discharge method, or the like. Next, the partition walls (insulating layers) 520 are formed by a sputtering method, a CVD method, a, printing method, a droplet discharge method, a spin coating method, an evaporation method, or the like. Note that the partition walls (insulating layers) 520 may be formed using an inorganic insulating material such as silicon oxide, silicon nitride, silicon oxynitride; acrylic acid, methacrylic acid, or a derivative thereof; a heat-resistant polymer, such as polyimide, aromatic polyamide, polybenzimidazole; or a siloxane resin. Further, a resin material such as a vinyl resin such as polyvinyl alcohol or polyvinyl butyral; an epoxy resin; a novolac resin; an acrylic resin; a melamine resin; or a urethane resin may be used. Alternatively, an organic material such as benzocyclobutene, parylene, fluorinated arylene ether, or polyimide; a composition containing a water-soluble homopolymer and a water-soluble copolymer; or the like may be used. In the cross-sectional view of the partition walls (insulating layers) 520 illustrated in FIG. 5B, it is preferable that the side surfaces of the partition walls (insulating layers) 520 be inclined by an angle of greater than or equal to 100 and less than or equal to 60°, preferably greater than or equal to 25° and less than or equal to 45° with respect to the surfaces of the first conductor 510. Further, it is preferable that the partition walls (insulating layers) 520 be curved. Such a shape can prevent a conductive paste to be discharged at the time of forming the second conductor 512 having a memory layer by a coating method such as a droplet discharge method from unnecessarily running off a desired position.

Next, a conductive paste including conductive particles, a solvent, and a resin is discharged onto the first conductor 510 by a coating method such as a droplet discharge method, and the solvent is vaporized. Accordingly, the conductive particles are in contact with each other, whereby conductivity which is high enough for a function as the second conductor develops in the substance to be discharged and the memory element 401 in which the resin remaining between the first conductor and the conductive particles functions as a memory layer can be manufactured. Note that it is preferable that the temperature at which the solvent is vaporized be higher than or equal to a room temperature and lower than or equal to the upper temperature limit of the resin.

Then, it is preferable to provide an insulating layer 522 which functions as a protective film so that the insulating layer 522 covers the partition walls (insulating layers) 520 and the second conductor 512 having a memory layer. Silicon oxide, silicon nitride, silicon oxynitride, or the like can be used for forming the insulating layer 522, and moisture, oxygen, or the like can be prevented from entering.

Further, in the cross-sectional view of the first conductor 510 illustrated in FIG. 5C, it is preferable that the side surface of the first conductor 510 be inclined by an angle of greater than or equal to 10° and less than 90° with respect to the substrate 521. Further, the first conductor 510 may have a curved shape in which the curvature radius changes continuously. With such a shape, the coverage by the second conductor 512 having a memory layer, and the like to be stacked over the first conductor 510 can be improved.

Note that since a discharge material used for forming the second conductor 512 having a memory layer is liquid, it is greatly affected by a surface state of a formation region.

Accordingly, the partition walls (insulating layers) 520 may be subjected to treatment for controlling wettability. The wettability of the solid surface is affected by the chemical property of the surface and the physical surface shape (surface roughness). Here, treatment for controlling the wettability of a surface means formation of regions having different wettabilities with respect to a liquid discharge material on a region where the discharge material is applied. Note that the regions having different wettabilities are regions having different wettabilities with respect to a discharge material, that is, regions having different contact angles with respect to a discharge material. A region having a larger contact angle with respect to a discharge material is a region having lower wettability (hereinafter such a region is also referred to as a "low-wettability region"), and a region having a smaller contact angle is a region having higher wettability (hereinafter also referred to as a "high-wettability region"). When a contact angle is large, a liquid discharge material does not spread on a surface where the discharge material is applied, while the discharge material spreads if the contact angle is small. Thus, regions having different wettabilities have different surface energies, and the surface energy of a low-wettability region is low, while the surface energy of a high-wettability region is high.

Note that the difference in wettabilities is relative to each region. Here, a low-wettability region is formed on the partition walls (insulating layers) 520 where the second conductor 512 having a memory layer is not formed. As a method of selectively forming a low-wettability region, a method in which a mask layer is formed and a layer is selectively formed of a low-wettability material with use of the mask, a method in which surface treatment for decreasing wettability is selectively performed, or the like can be used.

For example, as a method for controlling surface wettability, there is a method in which wettability is changed by decomposition of a surface substance and modification of a region surface using light irradiation energy. As the low-wettability substance, a substance containing a fluorocarbon group (or fluorocarbon chain) or a substance containing a silane coupling agent can be used. The silane coupling agent can form a monomolecular film; therefore, modification can be efficiently carried out and wettability is changed in a short time. In addition, a silane coupling agent having a fluorocarbon chain, a silane coupling agent having an alkyl group, or the like may be arranged over a substrate, so that the surface wettability can be lower. Also, as the low-wettability substance, a titanate coupling agent or an aluminate coupling agent may be used.

Since a liquid discharge material moves to a side where wettability is high, a pattern can be formed in a more accurate position. Further, material use efficiency can be increased.

Figure 6A:
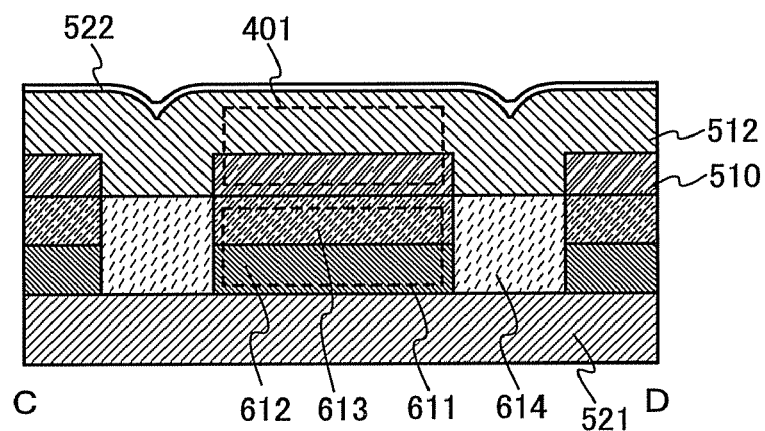
FIGS. 6A and 6B are views illustrating examples of structures of a memory element.

Further, as illustrated in the cross-sectional structure taken along the line C-D in FIG. 6A, an element having a rectifying property may be provided between the first conductor 510 and the substrate 521 in the memory element 401. As the element having a rectifying property, a diode-connected transistor and the like are given in addition to a Schottky-barrier diode, a PIN junction diode, and a PN junction diode. Here, a diode 611 including a third conductor 612 and a semiconductor layer 613 is provided under and in contact with the first conductor 510. Note that the diodes 611 each of which corresponds to each memory element are isolated from each other by an interlayer insulating film 614. Alternatively, the element having a rectifying property may be provided over and in contact with the second conductor 512.

Figure 6B:
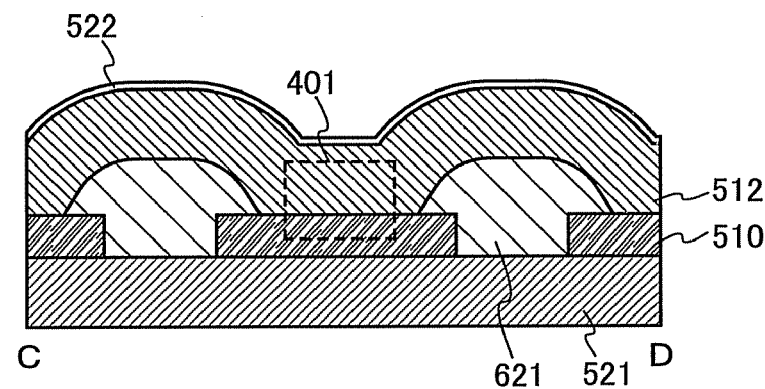

Further, if an effect of an electric field on between memory elements adjacent to each other in the second direction (C-D) is a concern, partition walls (insulating layers) 621 may be provided between the first conductors 510 of the memory elements as illustrated in FIG. 6B. Thus, an effect of an electric field on between adjacent memory elements is prevented, and in addition to that, breakage caused by a step of the first conductor 510 when the second conductor 512 having a memory layer is provided so as to cover the first conductor 510 can also be prevented.

Note that in the cross-sectional view of the partition walls (insulating layers) 621 illustrated in FIG. 6B, it is preferable that the side surfaces of the partition walls (insulating layers) 621 be inclined by an angle of greater than or equal to 10° and less than or equal to 60°, preferably greater than or equal to 25° and less than or equal to 45° with respect to the surfaces of the first conductor 510. Further, it is preferable that the partition walls (insulating layers) 621 be curved. After the partition walls (insulating layers) 621 are provided as described above, the second conductor 512 having a memory layer is formed so as to cover the first conductor 510 and the partition walls (insulating layers) 621.

Next, operation of writing data to a memory element will be described. Here, a case of writing data by an electric action, typically by voltage applied thereto, will be described with reference to FIG. 4A. Note that the data is written by change of electrical characteristics of the memory element, and "0" and "1" refer to data in an initial state (a state where an electric action is not applied) of the memory element and data in a state where the electrical characteristics are changed, respectively.

When data "1" is written to one of the memory elements 401, first, the memory element 401 is selected by the decoders 412 and 413, and the selector 414. Specifically, predetermined potential V2 is outputted to the word line W3 connected to the memory element 401 by the decoder 413. In addition, the bit line B3 connected to the memory element 401 is connected to the read/write circuit 415 by the decoder 412 and the selector 414. Then, writing potential V1 is outputted to the bit line B3 from the read/write circuit 415. Thus, a voltage Vw=V1−V2 is applied between the first conductor and the second conductor included in the memory element 401. By proper selection of the voltage Vw, a memory layer which is provided between the conductors is changed physically or electrically. The above physical or electrical change of the memory layer corresponds to the writing of data "1". Specifically, as for a reading voltage, electric resistance between the first and second conductors at the time when the memory element 401 is in the state of the data "1" may be largely lowered than electric resistance therebetween at the time when the memory element 401 is in the state of data "0". The first conductor and the second conductor may be simply short-circuited. The voltage Vw may be greater than or equal to 3 V and less than or equal to 10 V, or greater than or equal to −10 V and less than or equal to −3 V.

Note that non-selected word lines and non-selected bit lines are controlled so that the data "1" is not written to the memory elements connected to the non-selected word lines and the non-selected bit lines. The above control may be performed in the following manner, for example: the non-selected word lines and the non-selected bit lines are made to be in a floating state, characteristics which are able to ensure selectivity, such as diode characteristics, are given to the memory elements, or substantially the same potential is outputted to the non-selected word lines and the non-selected bit lines.

On the other hand, in the case where data "0" is written to the memory element 401, an electric action is not applied to the memory element 401. As for circuit operation, for example, the memory element 401 is selected by the decoders 412 and 413, and the selector 414 as well as the case of writing data "1". At this time, the output potential from the read/write circuit 415 to the bit line B3 is set to be substantially the same level as the potential of the selected word line W3 or the potential of the non-selected word lines. Accordingly, voltage applied between the first conductor and the second conductor included in the memory element 401 is lowered and the electrical characteristics of the memory element 401 are prevented from being changed.

Figure 4B:
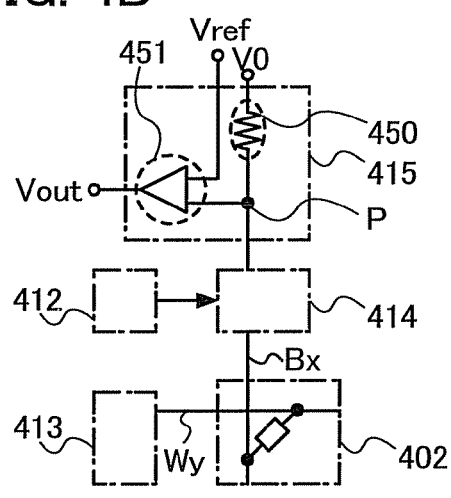
Figure 4C:
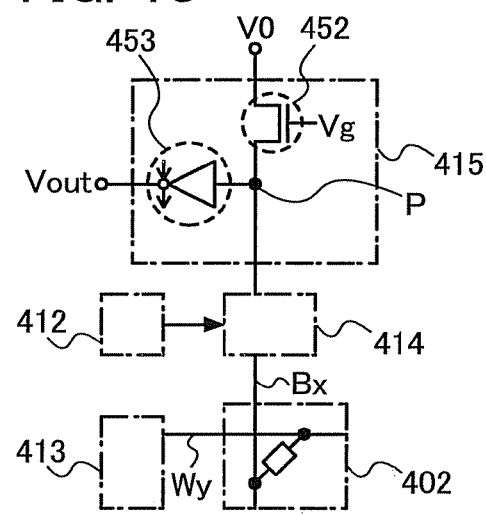

Subsequently, operation of reading data from a memory element will be described with reference to FIG. 4B. Data is read by utilization of a difference in electrical characteristics between the first and second conductors included in the memory element which have the data "0" and a memory element having the data "1". For example, a method of reading data by utilization of a difference in electric resistances at the time when effective electric resistance between the first and second conductors included in the memory element having the data "0" (hereinafter, simply referred to as electric resistance of the memory element) is R0 at a reading voltage and electric resistance of the memory element having the data "1" is set to be R1 at a reading voltage, will be described. Note that R1<<R0. As a structure of a reading portion of the read/write circuit 415, for example, a circuit including a resistance element 450 and a differential amplifier 451 illustrated in FIG. 4B can be used. The resistance element 450 has resistance Rr, where R1<Rr<R0. A transistor 452 may be used as a substitute for the resistance element 450 as illustrated in FIG. 4C, or a clocked inverter 453 can be used as a substitute for the differential amplifier 451. A signal φ or an inversion signal thereof, which becomes High when data is read and Low when no data is read, is inputted to the clocked inverter 453. Needless to say, the circuit configurations are not limited to those illustrated in FIGS. 4B and 4C.

In the case where data is read from memory elements 402, first, the memory element 402 is selected by the decoders 412 and 413, and the selector 414. Specifically, predetermined potential Vy is outputted to the word line Wy connected to the memory element 402 by the decoder 413. In addition, the bit line Bx connected to the memory element 402 is connected to a node P of the read/write circuit 415 by the decoder 412 and the selector 414. As a result, potential Vp of the node P becomes a value determined by resistance division of Vy and V0 caused by the resistance element 450 (resistance Rr) and the memory element 402 (resistance R0 or R1). Therefore, when the memory element 402 has the data "0", potential Vp0 of the node P is Vp0=Vy+(V0−Vy)×R0/(R0+Rr). In addition, when the memory element 402 has the data "1", potential Vp1 of the node P is Vp1=Vy+(V0−Vy)×R1/(R0+Rr). As a result, Low/High (or High/Low) is outputted as output potential Vout in accordance with the data "0" and data "1", and can be read by selection of Vref so as to be between Vp0 and Vp1 in FIG. 4B and selection of a variation point of the clocked inverter 453 between Vp0 and Vp1 in FIG. 4C.

For example, the differential amplifier 451 is operated when Vdd is 1.5 V, and Vy is set at 0 V; V0, 1.5 V; and Vref, 0.75 V. If R0/Rr=Rr/R1=9, in the case where the memory element has the data "0", Vp0 becomes 1.35 V and High is outputted as Vout. In the case where the memory element has the data "1", Vp1 becomes 0.15 V and Low is outputted as Vout. Accordingly, data can be read from the memory element.

By the above method, the data "0" or the data "1" to be held by the memory element is determined by a voltage value obtained by utilization of the difference in resistance values of the memory layer and resistance division. Needless to say, the method of reading data is not limited to this method. For example, reading may be performed by utilization of difference in current values other than utilization of the difference in the resistance values. Moreover, in the case where electrical characteristics of a memory element have diode characteristics in which a threshold voltage is different between the data "0" and the data "1", data may be read by utilization of difference in the threshold voltages.

In addition, a thin film transistor (TFT) may be provided over an insulating substrate, and the memory element or a memory cell array may be provided thereover. Alternatively, instead of the insulating substrate, a semiconductor substrate such as a Si substrate or an SOI substrate may be used to manufacture a field-effect transistor (FET) over the substrate, and the memory element or a memory cell array may be provided thereover.

Regarding the semiconductor device described in this embodiment, data can not only be written once but also be written additionally. Since data once written to a memory element cannot be erased, it is possible to prevent forgery by rewriting. Further, since the semiconductor device includes a memory element which can be easily manufactured, a semiconductor device with excellent performance and reliability can be manufactured inexpensively.

Note that this embodiment can be combined with any of the other embodiments as appropriate. For example, the memory element included in the semiconductor device described in this embodiment can have a structure in which an insulating layer or a semiconductor layer is provided between the first conductor and the second conductor having a memory layer.

Embodiment 3

In this embodiment, a semiconductor device including the memory element of Embodiment 1 will be described with reference to FIGS. 7A to 7C. Specifically, an active matrix memory device will be described in this embodiment.

Figure 7A:
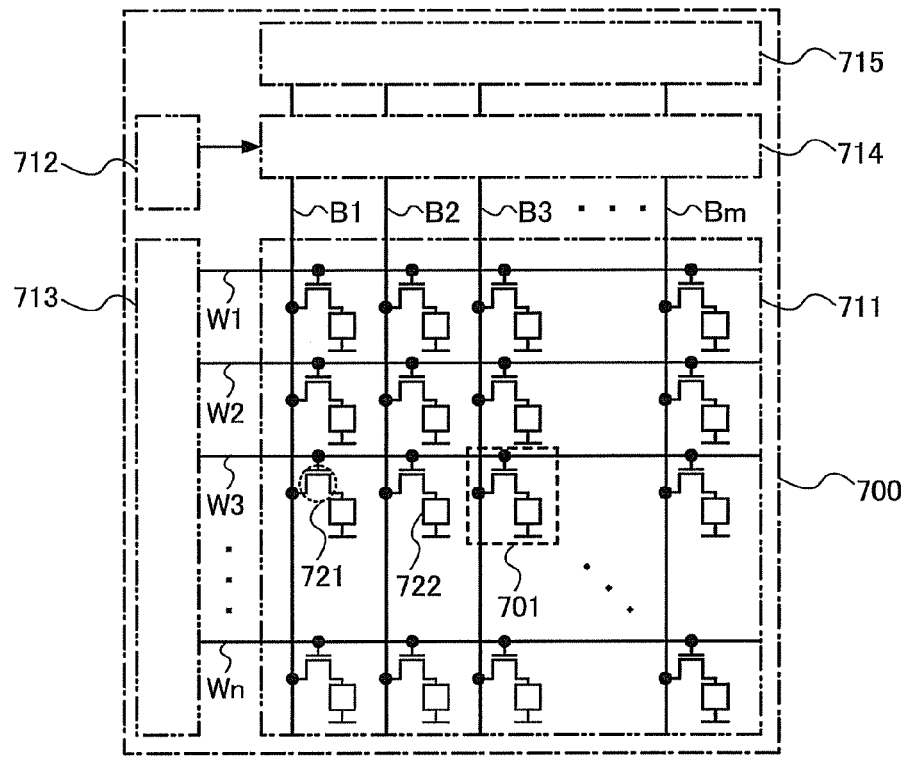
FIGS. 7A to 7C are views illustrating an example of a structure of a semiconductor device.
Figure 7B:
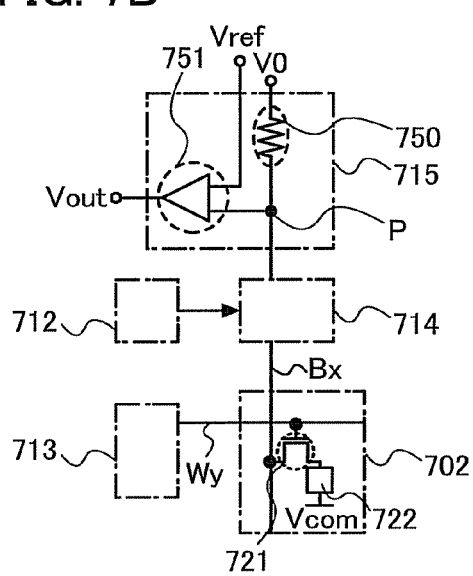
Figure 7C:
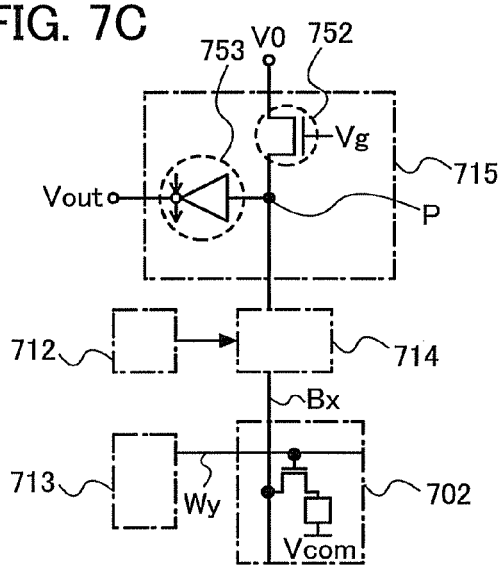

An example of a structure of a semiconductor device described in this embodiment is illustrated in FIG. 7A. A semiconductor device 700 includes a memory cell array 711 where memory cells 701 are arranged in matrix, decoders 712 and 713, a selector 714, and a read/write circuit 715. The structure of the semiconductor device 700 which is described here is only one example and the semiconductor device 700 may also include other circuits such as a sense amplifier, an output circuit, or a buffer.

Note that the decoders 712 and 713, the selector 714, the read/write circuit 715, an interface, and the like may also be formed over a substrate as with the memory element. Alternatively, they may be attached externally as IC chips.

The memory cell 701 includes a first wiring connected to a bit line Bx ($1 \leq x \leq m$), a second wiring connected to a word line Wy ($1 \leq y \leq n$), a thin film transistor 721, and a memory element 722. The memory element 722 has a structure where a memory layer is interposed between a pair of conductors.

Figure 8A:
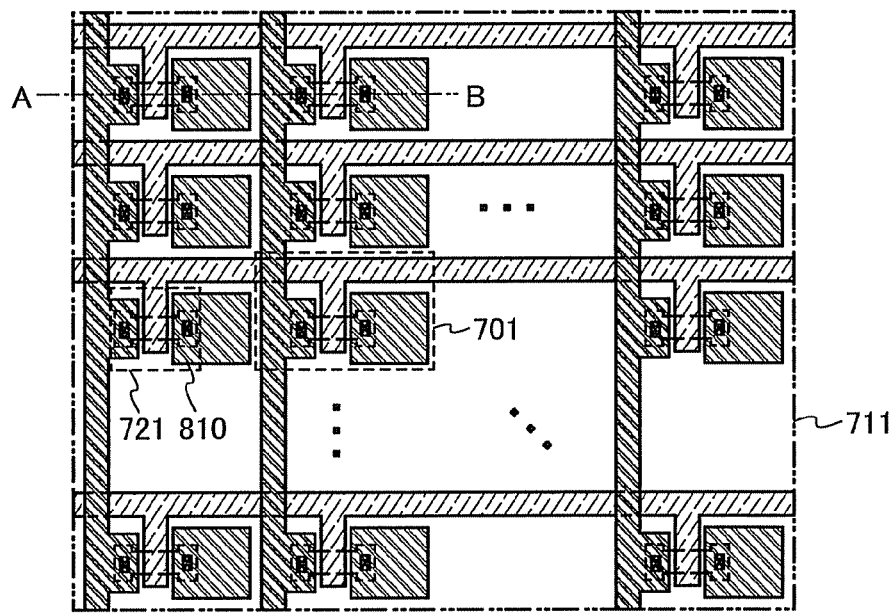
FIGS. 8A to 8C are views illustrating a memory cell included in a semiconductor device.
Figure 8B:
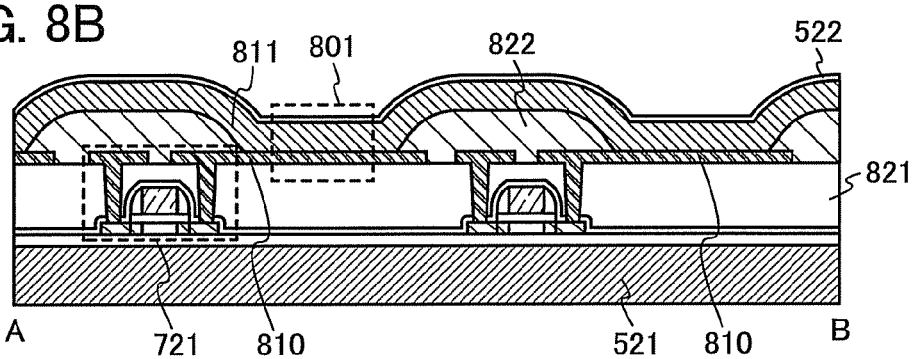
Figure 8C:
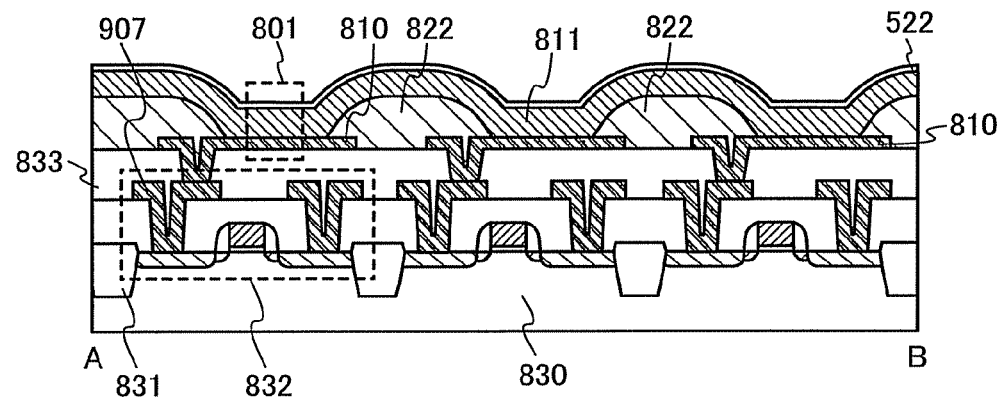

Next, a top view an example of the memory cell array 711 is illustrated in FIG. 8A and cross-sectional views thereof are illustrated in FIGS. 8B and 8C. Note that FIG. 8A is a top view illustrating part of the memory cell array 711.

In the memory cell array 711, a plurality of memory cells 701 are provided in matrix. Alternatively, in the memory cell 701, a thin film transistor 721 serving as a switching element and a memory element 722 connected to the thin film transistor 721 are provided over a substrate having an insulating surface.

FIG. 8B illustrates an example of a cross-sectional structure taken along the line A-B in FIG. 8A. Note that, in FIG.

8A, partition walls (insulating layers) 822, a second conductor 811 having a memory layer, and the insulating layer 522 which are provided over a first conductor 810 are omitted.

The memory cell 701 includes the thin film transistor 721, a memory element 801, an insulating layer 821, and the partition walls (insulating layers) 822 covering part of the first conductor 810. Note that the insulating layer 522 functioning as a protective film is provided so as to cover the memory element 801. The memory element 801 connected to the thin film transistor 721 which is formed over the substrate 521 having an insulating surface includes the first conductor 810 and the second conductor 811 having a memory layer which are formed over the insulating layer 821. Moreover, there is no particular limitation on the thin film transistor 721 as long as it functions as a switch, and a transistor other than a thin film transistor may be used.

Figure 9A:
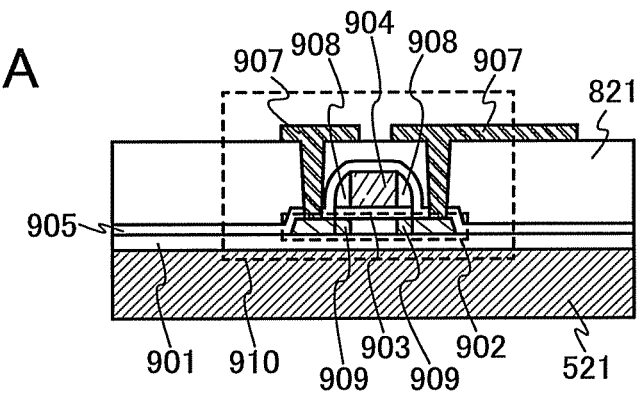
FIGS. 9A to 9D are views illustrating a mode of a thin film transistor.

The thin film transistor 721 will be described with reference to FIGS. 9A to 9D. FIG. 9A illustrates an example in which a top-gate thin film transistor is applied to the thin film transistor 721. An insulating layer 901 is provided over a substrate 521 as a base film, and a thin film transistor 910 is provided over the insulating layer 901. In the thin film transistor 910, a semiconductor layer 902 and an insulating layer 903 functioning as a gate insulating layer are provided over the insulating layer 901, and further a gate electrode 904 is formed over the semiconductor layer 902 with the insulating layer 903 therebetween. Note that an insulating layer 905 functioning as a protective layer and the insulating layer 821 functioning as an interlayer insulating layer are formed over the thin film transistor 910. Moreover, wirings 907 each connected to a source region or a drain region of the semiconductor layer are formed.

An insulating film such as a silicon oxide film, a silicon nitride film, or a silicon oxynitride film is used to form the insulating layer 901, which is formed in a single layer or a multilayer of two or more layers of these insulating films. Note that the insulating layer 901 may be formed by a sputtering method, a CVD method, or the like.

For the semiconductor layer 902, a crystalline semiconductor such as polysilicon may be used as well as an amorphous semiconductor such as amorphous silicon, a semiamorphous semiconductor, or a microcrystalline semiconductor.

In particular, it is preferable to use a crystalline semiconductor obtained by crystallization of amorphous or microcrystalline semiconductor with laser irradiation, a crystalline semiconductor obtained by crystallization of amorphous or microcrystalline semiconductor through heat treatment, or a crystalline semiconductor obtained by crystallization of amorphous or microcrystalline semiconductor with a combination of heat treatment and laser irradiation. In the heat treatment, a crystallization method using a metal element such as nickel which can promote crystallization of silicon semiconductor can be used.

In the case of the crystallization with laser irradiation, it is possible to conduct crystallization in such a way that a portion in a crystalline semiconductor that is melted by irradiation with laser light is continuously moved in a direction where the laser light is delivered, wherein the laser light is continuous wave laser light or ultrashort pulsed laser light having a high repetition rate of greater than or equal to 10 MHz and a pulse width of less than or equal to 1 nanosecond, preferably 1 picosecond to 100 picoseconds. By such a crystallization method, a crystalline semiconductor having a crystal with a large grain diameter and a crystal grain boundary extending in one direction can be obtained. A drift direction of carriers is conformed to the direction where the crystal grain boundary extends, whereby the field effect mobility in the transistor can be increased. For example, field effect mobility of higher than or equal to 400 cm$^2$/V·sec can be achieved.

In the case where the above crystallization step is performed at a temperature lower than or equal to the upper temperature limit of a glass substrate (about 600° C.), a large-size glass substrate can be used. Therefore, a large number of semiconductor devices can be manufactured at a time, and accordingly reduction in cost is possible.

In addition, with use of a highly heat-resistant substrate, the semiconductor layer 902 may be formed by a crystallization step which is performed at a temperature higher than or equal to the upper temperature limit of a glass substrate. Typically, a quartz substrate is used as the insulating substrate and an amorphous or microcrystalline semiconductor is heated at a temperature higher than or equal to 700° C. to form the semiconductor layer 902. As a result, a semiconductor with higher degree of crystallinity can be formed. In that case, a thin film transistor which is superior in response speed, mobility, and the like and can be operated at high speed can be provided.

The gate electrode 904 can be formed using metal or a polycrystalline semiconductor to which an impurity imparting one conductivity type is added. In the case of using metal, tungsten (W), molybdenum (Mo), titanium (Ti), tantalum (Ta), aluminum (Al) or the like can be used. Alternatively, metal nitride obtained by nitridation of metal can be used. Further alternatively, the gate electrode 904 may include a first layer formed from the metal nitride and a second layer formed from the metal to be stacked. In the case where the gate electrode 904 has a stacked-layer structure, a so-called hat shape, where an edge portion of the first layer may protrude from an edge portion of the second layer, may be employed. The first layer is formed using metal nitride, whereby the first layer can serve as barrier metal. In other words, the first layer can prevent metal contained in the second layer from dispersing in the insulating layer 903 and the semiconductor layer 902 thereunder.

Note that sidewalls (sidewall spacers) 908 may be provided on both side faces of the gate electrode 904. An insulating layer is formed by a CVD method and anisotropic etching is performed on the insulating layer by an RIE (reactive ion etching) method, whereby the sidewalls can be formed.

The thin film transistor in which the semiconductor layer 902, the insulating layer 903, the gate electrode 904, and the like are included in combination can employ various kinds of structures such as a single drain structure, an LDD (lightly doped drain) structure, and a gate overlapped drain structure. Note that, in FIG. 9A, a thin film transistor with an LDD structure in which low-concentration impurity regions 909 are formed in a semiconductor layer overlapping with sidewalls is illustrated. Alternatively, a single gate structure, a multi-gate structure, in which transistors, to which gate voltage having the same potential in terms of equivalence is applied, are connected in series, a dual-gate structure in which a semiconductor layer is interposed between gate electrodes, or the like can also be employed.

The insulating layer 821 is formed using an inorganic insulating material such as silicon oxide or silicon oxynitride, or an organic insulating material such as an acrylic resin or a polyimide resin. In the case of using a coating method such as spin coating and a roll coater, an insulating layer such as a silicon oxide layer formed by heat treatment can be used as the insulating layer 821 after a material for an insulating film, which is melted in an organic solvent, is applied. For example, an insulating layer which can be formed by heat treatment at 200° C. to 400° C. after a coating film including siloxane bonds is formed can be used as the insulating layer

821. An insulating layer formed by a coating method or an insulating layer which is planarized by reflow is formed as the insulating layer 821, whereby disconnection of a wiring provided over the insulating layer 821 can be prevented. Further, the present invention can be effectively used also when a multi-layer wiring is formed.

The wirings 907 formed over the insulating layer 821 can be provided to intersect with a wiring formed in the same layer as the gate electrode 904, and a multilayer wiring structure is formed. A plurality of insulating layers having a function similar to that of the insulating layer 821 are stacked and a wiring is formed thereover, whereby a multilayer wiring structure can be formed. The wiring 907 is preferably formed in combination of a low resistance material such as aluminum (Al) and barrier metal using a high melting point metal material such as titanium (Ti) or molybdenum (Mo), for example, in a stacked-layer structure of titanium (Ti) and aluminum (Al), a stacked-layer structure of molybdenum (Mo) and aluminum (Al), or the like.

Figure 9B:
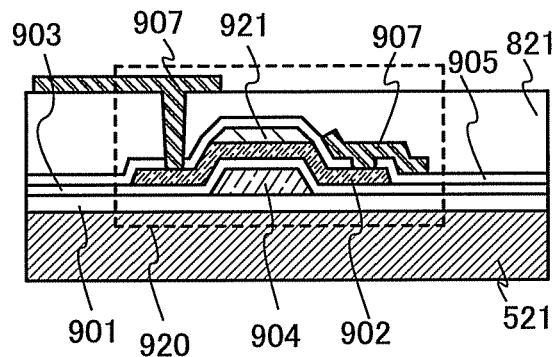

FIG. 9B illustrates an example in which a bottom-gate thin film transistor is applied. The insulating layer 901 is formed over an insulating substrate as the substrate 521, and a thin film transistor 920 is provided thereover. In the thin film transistor 920, the gate electrode 904, the insulating layer 903 functioning as a gate insulating layer, and the semiconductor layer 902 are provided, and a channel protective layer 921, the insulating layer 905 functioning as a protective layer, and the insulating layer 821 functioning as an interlayer insulating layer are provided thereover. Moreover, an insulating layer functioning as a protective layer may be formed thereover. Wirings 907 each connected to a source region or a drain region of the semiconductor layer can be formed over the insulating layer 905 or the insulating layer 821. Note that the insulating layer 901 is not necessarily provided in the case of the bottom-gate thin film transistor.

When the substrate 521 is a flexible substrate, the substrate 521 has a lower upper temperature limit than a non-flexible substrate such as a glass substrate. Therefore, the semiconductor layer of the thin film transistor is preferably formed using an organic semiconductor.

Figure 9C:
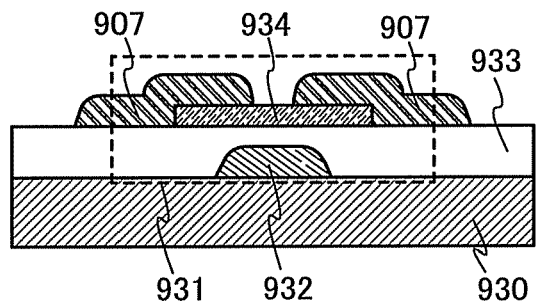

Here, a structure of a thin film transistor formed using an organic semiconductor for a semiconductor layer will be described with reference to FIGS. 9C and 9D. FIG. 9C illustrates an example in which a staggered organic semiconductor transistor is applied. An organic semiconductor transistor 931 is provided over a flexible substrate 930. The organic semiconductor transistor 931 includes a gate electrode 932, an insulating layer 933 functioning as a gate insulating film, and a semiconductor layer 934 which is provided in a place where the gate electrode 932 and the insulating layer 933 overlap, and wirings 907 are connected to the semiconductor layer 934. Note that the semiconductor layer is in contact with the insulating layer 933 functioning as a gate insulating film and the wirings 907.

The gate electrode 932 can be formed using a material and a method similar to those of the gate electrode 904. Alternatively, the gate electrode 932 can also be formed by being dried and baked by a droplet discharge method. Further alternatively, the gate electrode 932 can be formed in such a manner that a paste containing conductive fine particles is printed on the flexible substrate 930 by a printing method and the paste is dried and baked. As a typical example of the conductive fine particles, fine particles mainly containing any one of gold, copper, an alloy of gold and silver, an alloy of gold and copper, an alloy of silver and copper, and an alloy of gold, silver, and copper may be used. Alternatively, fine particles mainly containing conductive oxide such as indium tin oxide (ITO) may be used.

The insulating layer 933 functioning as a gate insulating film can be formed using a material and a method similar to those of the insulating layer 903. However, when the insulating layer is formed by heat treatment after a material for an insulating film which is dissolved in an organic solvent is coated, the heat treatment is performed at a temperature lower than the upper temperature limit of the flexible substrate.

As a material for the semiconductor layer 934 of the organic semiconductor transistor, a polycyclic aromatic compound, a conjugated double bond compound, phthalocyanine, a charge transfer complex, and the like can be given. For example, anthracene, tetracene, pentacene, 6 T (hexathiophene), TCNQ (tetracyanoquinodimethane), PTCDA (a perylene carboxylic acid anhydrous compound), NTCDA (a naphthalenecarboxylic acid anhydrous compound), or the like can be used. Moreover, as a material for the semiconductor layer 934 of the organic semiconductor transistor, a π-conjugated polymer such as an organic polymer compound, carbon nanotube, polyvinyl pyridine, a phthalocyanine metal complex, and the like can be given. In particular, a π-conjugated polymer composed of a conjugated double bond such as polyacetylene, polyaniline, polypyrrole, polythienylene, a polythiophene derivative, poly(3alkylthiophene), a polyparaphenylene derivative, or a polyparaphenylenevinylene derivative, is preferably used.

As a method of forming the semiconductor layer of the organic semiconductor transistor, an evaporation method, a coating method, a spin coating method, a bar coating method, a solution casting method, a dip coating method, a screen printing method, a roll coating method, or a droplet discharge method can be used. The thickness of the semiconductor layer is greater than or equal to 1 nm and less than or equal to 1000 nm, preferably greater than or equal to 10 nm and less than or equal to 100 nm.

Figure 9D:
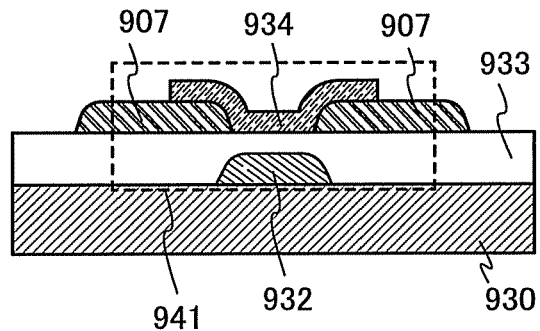

FIG. 9D illustrates an example in which a coplanar organic semiconductor transistor is applied. An organic semiconductor transistor 941 is provided over a flexible substrate 930. The organic semiconductor transistor 941 includes the gate electrode 932, the insulating layer 933 functioning as a gate insulating film, and the semiconductor layer 934 which is provided in a place where the gate electrode 932 and the insulating layer 933 overlap, and the wirings 907 are connected to the semiconductor layer 934. In addition, the wirings 907 are each in contact with the semiconductor layer 934 and the insulating layer 933 functioning as a gate insulating film.

The thin film transistor or the organic semiconductor transistor may have any kind of structure as long as the transistor can function as a switching element. Note that the wirings 907 may be used as a first conductor in a memory element, or a memory element may be connected to the wirings 907.

Furthermore, a transistor may be formed using a single crystal substrate or an SOI substrate, and a memory element may be provided thereover. The SOI substrate may be formed by a method in which a wafer is attached, a method of forming an insulating layer 831 in an interior portion by implantation of oxygen ions into a silicon substrate, which is referred to as an SIMOX.

For example, in the case of using a single crystal semiconductor for the substrate, as illustrated in FIG. 8C, the memory element 801 is connected to the field effect transistor 832 provided using a single crystal semiconductor substrate 830. In addition, an insulating layer 833 is provided so as to cover a wiring of the field-effect transistor 832, and the memory element 801 is provided over the insulating layer 833.

Since the transistor formed using such a single crystal semiconductor has favorable characteristics of response speed and mobility, it is possible to provide a transistor which can be operated at high speed. Further, such a transistor has less variation in its characteristics, and therefore, a highly reliable semiconductor device can be provided.

Further, the memory element 801 is formed after the insulating layer 833 is provided, so that the first conductor 810 can be freely arranged. In other words, the memory element has to be provided in a region outside the wiring connected to the transistor, in the structure illustrated in FIG. 8B; however, by provision of the insulating layer 833, it becomes possible to form, for example, the memory element 801 also above the transistor 832 as illustrated in FIG. 8C. Accordingly, a memory circuit can be highly integrated. Needless to say, the wiring 907 included in the field effect transistor 832 may be used as a first conductor included in the memory element.

Note that the memory element 801 includes a first conductor 810 formed over the insulating layer 833 and the second conductor 811 having a memory layer, and is manufactured in a similar manner to Embodiment 1.

Figure 10:
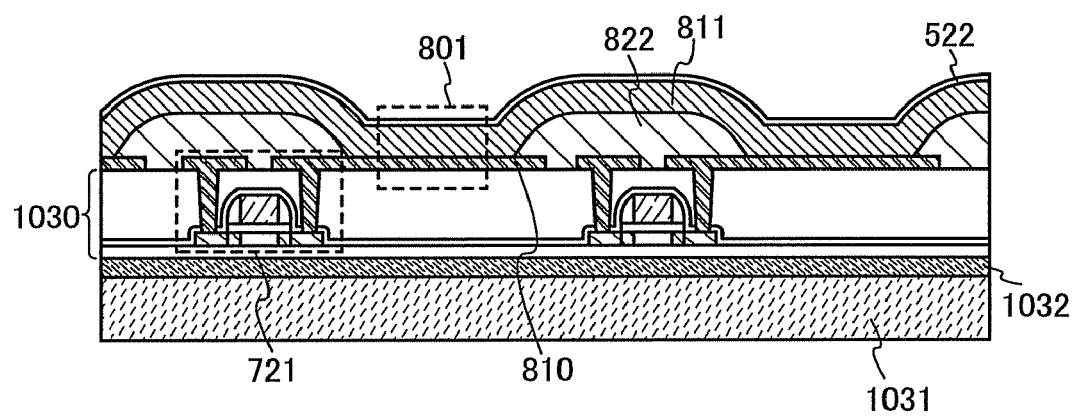
FIG. 10 is a view illustrating part of a cross section of a semiconductor device.

Moreover, after a separation layer is provided over a substrate and the memory element 801 and a layer 1030 including a transistor are formed over the separation layer, the memory element 801 and the layer 1030 including a transistor may be separated from the substrate with use of the separation layer, and, as illustrated in FIG. 10, the memory element 801 and the layer 1030 including a transistor may be bonded to a substrate 1031 which is different from the above substrate, with use of an adhesive layer 1032. As a separation method, the following four methods and the like may be used: a first peeling method where a metal oxide layer is provided as a peeling layer between a substrate having high heat resistance and a layer having a transistor, and the metal oxide layer is weakened by crystallization so as to peel the layer having the transistor; a second peeling method where an amorphous silicon film containing hydrogen is provided as a peeling layer between a substrate having high heat resistance and a layer having a transistor, and the amorphous silicon film is removed by laser light irradiation or etching so as to peel the layer having the transistor; a third peeling method where a substrate having high heat resistance over which a layer having a transistor is formed, is mechanically removed or removed by etching using a solution or a halogen fluoride gas such as $NF_3$, $BrF_3$, or $ClF_3$; and a fourth peeling method where, after a metal layer and a metal oxide layer are provided as peeling layers between a substrate having high heat resistance and a layer having a transistor, the metal oxide layer is weakened by crystallization, and part of the meal layer is removed by etching using a solution or halogen fluoride gas such as $NF_3$, $BrF_3$, or $ClF_3$, and then the layer having the transistor is physically separated at the weakened metal oxide layer.

Further, a flexible substrate, a film, paper made of a fibrous material, or the like is used as the substrate 1031, whereby reduction in size, thickness, and weight of the memory device can be realized.

Next, operation of writing data to the semiconductor device 700, typically the memory device, will be described with reference to FIG. 7A. As in Embodiment 2, here, an operation of writing data by an electric action, typically, by voltage applied thereto will be described. Note that the data is written by change of the electrical characteristics of the memory cell, and "0" and "1" refer to data in an initial state (a state where an electric action is not applied) of the memory cell and data in a state where the electrical characteristics are changed, respectively.

A case of writing data to the memory cell 701 in the y-th row and the x-th column will be described. In the case where data "1" is written to the memory cell 701, first, the memory cell 701 is selected by the decoders 712 and 713, and the selector 714. Specifically, predetermined potential V22 is outputted to the word line Wy connected to the memory cell 701 by the decoder 713. In addition, a bit line Bx connected to the memory cell 701 is connected to the read/write circuit 715 by the decoder 712 and the selector 714. Then, writing potential V21 is outputted to the bit line Bx from the read/write circuit 715.

The thin film transistor 721 included in the memory cell is turned on in such a manner, a common electrode and the bit line are electrically connected to the memory element 722, and a voltage of about Vw=Vcom−V21 is applied. Vcom is a common electrode in the memory element 722, that is, potential of the second conductor. By proper selection of the voltage Vw, a memory layer which is provided between first and second conductors is changed physically or electrically. The above physical or electrical change of the memory layer corresponds to the writing of data "1". Specifically, as for a reading voltage, electric resistance between the first and second conductors when the memory element 401 is in the state of the data "1" may be largely lowered than electric resistance therebetween at the time when the memory element 401 is in the state of data "0". The first conductor and the second conductor may be simply short-circuited. The voltage Vw may be greater than or equal to 3 V and less than or equal to 10 V, or greater than or equal to −10 V and less than or equal to −3 V.

Note that non-selected word lines and non-selected bit lines are controlled so that the data "1" is not written to the memory cells connected to the non-selected word lines and the non-selected bit lines. Specifically, transistors of the memory cells which are connected to the non-selected word lines may be turned off, or potential which is the same level as Vcom may be applied to the first conductor.

On the other hand, in the case where data "0" is written to the memory cell 701, an electric action is not be applied to the memory cell 701. As for circuit operation, for example, the memory cell 701 is selected by the decoders 712 and 713, and the selector 714 as well as the case of writing data "1". At this time, the output potential to the bit line Bx from the read/write circuit 715 is set to be substantially the same level as Vcom or to be potential which turns off the thin film transistor 721 of the memory cell. Accordingly, voltage which is low enough not to change the electrical characteristics is applied to the memory element 722 or no voltage is applied to the memory element 722; therefore, writing of the data "0" can be realized.

Next, operation of reading data by an electric action will be described with reference to FIG. 7B. Data is read by utilization of a difference in electrical characteristics of the memory elements 722, which are different between a memory cell having data "0" and another memory cell having data "1". For example, a method of reading data by utilization of a difference in electric resistances will be described under conditions where electric resistance of a memory element included in a memory cell having the data "0" is set to be R0 at a reading voltage, and electric resistance of a memory element included in a memory cell having the data "1" is set to be R1 at a reading voltage. Note that R1<<R0. As a structure of a reading portion of the read/write circuit 715, for example, a circuit including a resistance element 750 and a differential amplifier 751 illustrated in FIG. 7B can be used. The resistance element 750 has resistance Rr, where R1<Rr<R0. A transistor 752 may be used as a substitute for the resistance element 750 as illustrated in FIG. 7C, or a clocked inverter 753 can be used as a substitute for the differential amplifier 751. Needless to say, the circuit configurations are not limited to those illustrated in FIGS. 7B and 7C.

In the case where data is read from a memory cell 702 in the x-th row and the y-th column, the memory cell 702 is selected by the decoders 712 and 713, and the selector 714. Specifically, predetermined potential V24 is outputted to a word line Wy connected to the memory cell 702 by the decoder 713, and the thin film transistor 721 is turned on. A bit line Bx connected to the memory cell 702 is connected to a node P of the read/write circuit 715 by the decoder 712 and the selector 714. As a result, potential Vp of the node P becomes a value determined by resistance division of Vcom and V0 caused by the resistance element 750 (resistance Rr) and the memory element 722 (resistance R0 or R1). Therefore, in the case where the memory cell 702 has the data "0", potential Vp0 of the node P is Vp0=Vcom+(V0−Vcom)×R0/(R0+Rr). In the case where the memory cell 702 has the data "1", potential Vp1 of the node P is Vp1=Vcom+(V0−Vcom)×R1/(R1+Rr). As a result, by selection of Vref to be between Vp0 and Vp1 in FIG. 7B and selection of a change point of the clocked inverter 753 to be between Vp0 and Vp1 in FIG. 7C, Low/High (or High/Low) of an output potential Vout is outputted in accordance with the data "0" or data "1"; accordingly, the data can be read.

For example, the differential amplifier 451 is operated when Vdd is 1.5 V, and Vcom is set at 0 V; V0, 1.5 V; and Vref, 0.75 V. If R0/Rr=Rr/R1=9 and on-resistance of the thin film transistor 721 can be ignored, when the memory cell has the data "0", Vp0 becomes 1.35 V and High is outputted as Vout. When the memory cell has the data "1", Vp1 becomes 0.15 V and Low is outputted as Vout. Accordingly, data can be read from the memory cell.

By the above method, the data "0" or the data "1" to be held by the memory element is determined by a voltage value obtained by utilization of the difference in resistance values of the memory element 722 and resistance division. Needless to say, the method for reading data is not limited to this method. For example, reading may be performed by utilization of difference in current values other than utilization of the difference in resistance values. Moreover, in the case where electronic characteristics of a memory cell have diode characteristics in which a threshold voltage is different between the data "0" and the data "1", data may be read by utilization of difference in threshold voltages.

In addition, a thin film transistor (TFT) may be provided over an insulating substrate, and the memory element or a memory cell array may be provided thereover. Alternatively, instead of the insulating substrate, a semiconductor substrate such as a Si substrate or an SOI substrate may be used to manufacture a field-effect transistor (FET) over the substrate, and the memory element or a memory cell array may be provided thereover.

Regarding the semiconductor device described in this embodiment, data can not only be written once but also be written additionally. Since data once written to a memory element cannot be erased, it is possible to prevent forgery by rewriting. Further, since the semiconductor device includes a memory element which can be easily manufactured, a semiconductor device with excellent performance and reliability can be manufactured inexpensively.

Note that this embodiment can be combined with any of the other embodiments as appropriate. For example, the memory element included in the semiconductor device described in this embodiment can have a structure in which an insulating layer or a semiconductor layer is provided between the first conductor and the second conductor having a memory layer.

Embodiment 4

In this embodiment, an example of a structure of a semiconductor device including the memory device described in any of the above embodiments will be described with reference to drawings.

A semiconductor device described in this embodiment has a feature that data can be wirelessly read and written. As a data transmission method of the semiconductor device, either of the following may be used: an electromagnetic coupling method in which communication is performed by mutual induction with a pair of coils disposed opposite to each other, an induced electromagnetic method in which communication is performed using an induction field, or an electric wave method in which communication is performed using electric waves. Moreover, there are two types of layouts of an antenna used for transmitting data: one is a case where an antenna is provided over a substrate over which a transistor and a memory element are provided and a case where a terminal portion is provided over a substrate over which a transistor and a memory element are provided and an antenna, which is provided over the other substrate, is connected to the terminal portion.

Figure 11A:
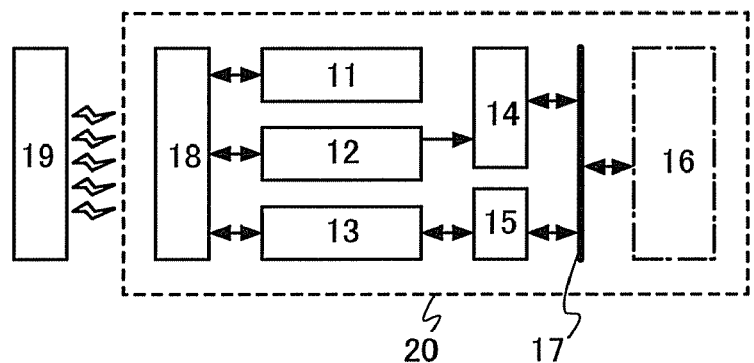
FIGS. 11A to 11C are views illustrating an example of a structure of a semiconductor device.
Figure 11B:
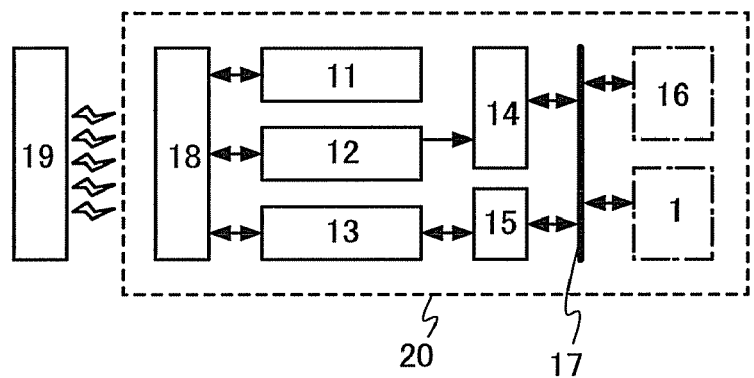

A structure of the semiconductor device described in this embodiment will be described with reference to FIGS. 11A to 11C. As illustrated in FIG. 11A, a semiconductor device 20 has a function of wirelessly transmitting/receiving data, and includes a power supply circuit 11, a clock generation circuit 12, a data demodulation/modulation circuit 13, a control circuit 14 for controlling other circuits, an interface circuit 15, a memory circuit 16, a bus 17, and an antenna 18, Moreover, as illustrated in FIG. 11B, the semiconductor device 20 has a function of wirelessly transmitting/receiving data, and may include a central processing unit 1 in addition to the power supply circuit 11, the clock generation circuit 12, the data demodulation/modulation circuit 13, the control circuit 14 for controlling other circuits, the interface circuit 15, the memory circuit 16, the bus 17, and the antenna 18.

Figure 11C:
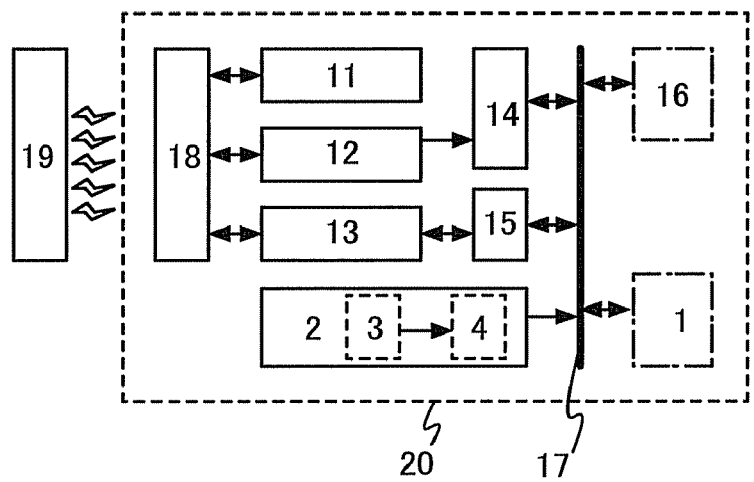

Furthermore, as illustrated in FIG. 11C, the semiconductor device 20 has a function of wirelessly transmitting/receiving data, and may include a detecting portion 2 including a detecting element 3 and a detection circuit 4 in addition to the power supply circuit 11, the clock generation circuit 12, the data demodulation/modulation circuit 13, the control circuit 14 for controlling other circuits, the interface circuit 15, the memory circuit 16, the bus 17, the antenna 18, and the central processing unit 1.

The power supply circuit 11 is a circuit which generates various power supplies to be supplied to the respective circuits in the semiconductor device 20, based on an alternating signal inputted from the antenna 18. The clock generation circuit 12 generates various clock signals to be supplied to respective circuits inside the semiconductor device 20 based on alternating current signals input from the antenna 18. The data modulation/demodulation circuit 13 has a function of modulating/demodulating data which is to be transmitted to and received from a reader/writer 19. The control circuit 14 has a function of controlling the memory circuit 16. The antenna 18 has a function of transmitting/receiving data using an electromagnetic field or an electric wave. The reader/writer 19 controls communication with the semiconductor device and processing of data of communication. Note that the semiconductor device is not limited to the above structure. For example, the semiconductor device may have an additional element such as a limiter circuit of power supply voltage or hardware only for processing codes.

The memory circuit 16 includes one or a plurality of memory elements selected from the memory elements described in Embodiment 1. The memory element described in Embodiment 1 is used as the memory circuit 16, whereby the memory circuit can be manufactured easily and inexpensively.

Moreover, data can not only be written to the memory element once but also be written additionally. Since data once written to a memory element cannot be erased, it is possible to prevent forgery by rewriting. Accordingly, a semiconductor device with high performance and reliability can be manufactured inexpensively.

The detecting portion 2 can detect temperature, pressure, flow rate, light, magnetism, sonic waves, acceleration, humidity, a gas component, a liquid component, and other characteristics by physical means or chemical means. The detecting portion 2 includes the detecting element 3 for detecting a physical quantity or a chemical quantity and the detection control circuit 4, which converts a physical quantity or a chemical quantity detected by the detecting element 3 into a suitable signal such as an electrical signal. The detecting element 3 can be formed using a resistance element, a capacitance coupled element, an inductively-coupled element, a photovoltaic element, a photoelectric conversion element, a thermovoltaic element, a transistor, a thermistor, a diode, or the like. Note that a plurality of detecting portions 2 may be provided. In that case, a plurality of physical quantities or chemical quantities can be detected at the same time.

Further, the physical quantities mentioned here indicate temperature, pressure, flow rate, light, magnetism, sonic waves, acceleration, humidity, and the like. The chemical quantities mentioned here indicate chemical substances such as a gas component like a gas and a liquid component like an ion, and the like. In addition to the above, the chemical quantities further include an organic compound like a certain biologic material contained in blood, sweat, urine, and the like (e.g., a blood-sugar level contained in blood). In particular, in order to detect a chemical quantity, a certain substance is inevitably detected selectively, and therefore, a substance which is selectively reacted a substance to be detected is provided in advance in the detecting element 3. For example, when a biologic substance is detected, enzyme, an antibody molecule, a microbial cell, and the like, which are selectively reacted with the biologic material to be detected by the detecting element 3, are preferably immobilized to a polymer and the like.

Figure 12A:
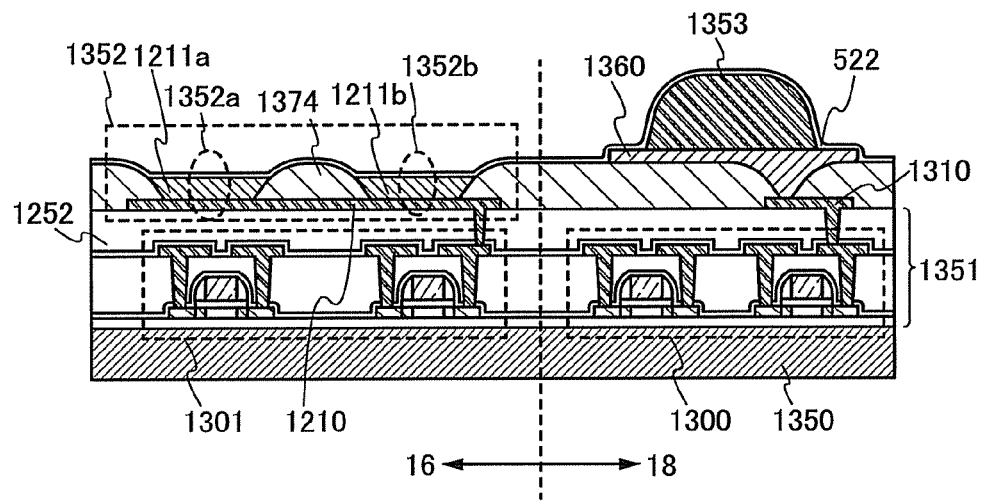
FIGS. 12A and 12B are views illustrating part of a cross section of a semiconductor device.
Figure 12B:
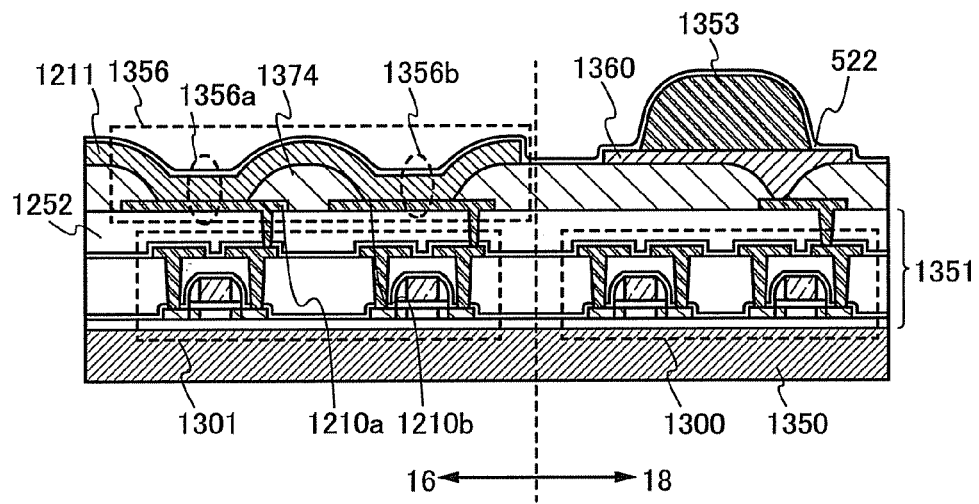

Next, FIGS. 12A and 12B each illustrate an example of a structure of a semiconductor device in which an antenna is provided over a substrate which is provided with a plurality of elements and memory elements. Note that FIGS. 12A and 12B are partial cross-sectional views of the memory circuit 16 and the antenna 18.

FIG. 12A illustrates an example of a semiconductor device including a passive matrix memory circuit. The semiconductor device includes, over a substrate 1350, a layer 1351 having a plurality of transistors 1300 and 1301, a memory element portion 1352 formed above the layer 1351 having the plurality of transistors, and a conductive layer 1353 functioning as an antenna.

Note that a case where the semiconductor device includes the memory element portion 1352 and the conductive layer 1353 functioning as an antenna above the layer 1351 having the plurality of transistors is described here; however, the present invention is not limited to this structure. The memory element portion 1352 or the conductive layer 1353 functioning as an antenna may be provided below or in the same layer as the layer 1351 having the transistors.

The memory element portion 1352 includes a plurality of memory elements 1352a and 1352b. The memory element 1352a includes a first conductor 1210 provided over an insulating layer 1252 and a second conductor 1211a having a memory layer, which is provided over the first conductor 1210. Further, the memory element 1352b includes the first conductor 1210 provided over the insulating layer 1252 and a second conductor 1211b having a memory layer provided over the first conductor 1210. Note that the memory elements 1352a and 1352b are separated from each other by a partition wall (insulating layer) 1374.

The first conductor 1210 in the memory element portion 1352 is connected to wirings of the plurality of transistor 1301. The memory element portion 1352 can be formed using a material and a method similar to those of the memory element described in the above embodiments. Further, an insulating layer 522 is formed, which functions as a protective film by covering the second conductors 1211a having a memory layer and 1211b having a memory layer and the conductive layer 1353 functioning as an antenna.

Note that the conductive layer 1353 functioning as an antenna is provided over the conductive layer 1360. The conductive layer 1360 may be formed after formation of the partition wall (insulating layer) 1374, and is connected to at least one of the plurality of transistors 1300 through a wiring 1310 formed in the same process as the first conductor 1210 in the memory element portion 1352.

The conductive layer 1353 functioning as an antenna is formed using a conductive material by a CVD method, a sputtering method, a printing method such as screen printing or gravure printing, a droplet discharge method, a dispenser method, a plating method, or the like. As the conductive material, an element selected from aluminum (Al), titanium (Ti), silver (Ag), copper (Cu), gold (Au), platinum (Pt), nickel (Ni), palladium (Pd), tantalum (Ta), and molybdenum (Mo), or an alloy material or a compound material containing any of the above elements as its main component is used to form the conductive layer 1353 as a single-layer or stacked-layer structure.

The transistors described in Embodiment 3, or the like can be selected as appropriate and used as the plurality of transistors included in the layer 1351 having the plurality of transistors.

Moreover, a separation layer is provided over the substrate; the layer 1351 having the plurality of transistors, the memory element portion 1352, and the conductive layer 1353 functioning as an antenna are formed over the separation layer; and the layer 1351 having the transistors, the memory element portion 1352, and the conductive layer 1353 functioning as an antenna are separated as appropriate using the separation method described in Embodiment 3 and may be attached to a substrate which is different from the above substrate with the use of an adhesive layer. As the substrate over which those layers are attached, a flexible substrate, a film, paper made of a fibrous material, a base film, or the like which is described as the substrate 521 in Embodiment 2 is used, whereby reduction in size, thickness, and weight of the memory device can be realized.

FIG. 12B shows an example of a semiconductor device having an active matrix type memory circuit. Note that portions in FIG. 12B which are different from those in FIG. 12A will be described.

The semiconductor device illustrated in FIG. 12B includes, over the substrate 1350, the layer 1351 having the plurality of transistors 1300 and 1301, a memory element portion 1356 formed above the layer 1351 having the plurality of transistors, and the conductive layer 1353 functioning as an antenna. Note that a case where the semiconductor device includes the memory element portion 1356 and the conductive layer 1353 functioning as an antenna above the layer 1351 having the plurality of transistors is described here; however, the present invention is not limited to this structure. The memory element portion 1356 or the conductive layer 1353 functioning as an antenna may be provided below or in the same layer as the layer 1351 having the plurality of transistors.

The memory element portion 1356 includes memory elements 1356a and 1356b. The memory element 1356a includes the first conductor 1210a formed over the insulating layer 1252 and a second conductor 1211 having a memory layer provided over the first conductor 1210a. Further, the memory element 1356b includes the first conductor 1210b provided over the insulating layer 1252 and the second conductor 1211 having a memory layer provided over the first conductor 1210b. Note that the memory elements 1356a and 1356b are separated from each other by a partition wall (insulating layer) 1374. The memory element portion 1356 can be formed using a material and a method similar to those of the memory element described in the above embodiments. In addition, each of the first conductors included in the memory elements is connected to a wiring of a transistor. In other words, the memory elements are connected to their respective transistors.

Moreover, a separation layer is provided over the substrate; the layer 1351 having the plurality of transistors, the memory element portion 1356, and the conductive layer 1353 functioning as an antenna are formed over the separation layer; and the layer 1351 having the transistors, the memory element portion 1356, and the conductive layer 1353 functioning as an antenna are separated as appropriate using the peeling method described in Embodiment 3 and may be attached to a substrate which is different from the above substrate with use of an adhesive layer.

Next, an example of a structure of a semiconductor device will be described using FIGS. 13A and 13B, where a layer having a plurality of transistors, a terminal portion connected to an antenna, and a memory element are formed over the first substrate, and an antenna connected to the terminal portion is formed on the second substrate. Note that portions in FIGS. 13A and 13B which are different from those in FIGS. 12A and 12B will be described.

Figure 13A:
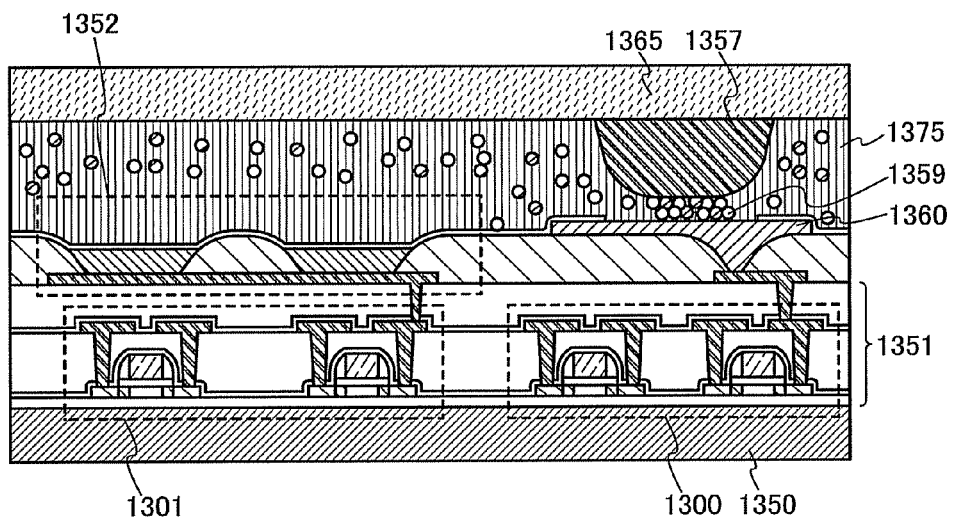
FIGS. 13A and 13B are views illustrating part of a cross section of a semiconductor device.

FIG. 13A illustrates an example of a semiconductor device having a passive matrix memory device. The semiconductor device includes the layer 1351 having the plurality of transistors 1300 and 1301, the memory element portion 1352 formed above the layer 1351 having the plurality of transistors, a terminal portion connected to an antenna, and a substrate 1365 on which a conductive layer 1357 functioning as an antenna is formed, which are formed over the substrate 1350; and the conductive layer 1357 and a conductive layer 1360 to be a connection terminal are electrically connected to each other by conductive particles 1359 contained in a resin 1375. Note that the substrate 1350 including the layer 1351 having the plurality of transistors, the memory element portion 1352, and the like and the substrate 1365 provided with the conductive layer 1357 functioning as an antenna are attached to each other by the resin 1375 having an adhesive property.

Alternatively, the conductive layer 1357 functioning as an antenna and the conductive layer 1360 to be a connection terminal may be connected to each other using a conductive adhesive agent such as a silver paste, a copper paste, and a carbon paste or a solder joint method. Note that a case where the memory element portion 1352 is provided above the layer 1351 having the plurality of transistors is described here; however, the present invention is not limited to this structure. The memory element portion 1352 may be provided below or in the same layer as the layer 1351 having the plurality of transistors.

Figure 13B:
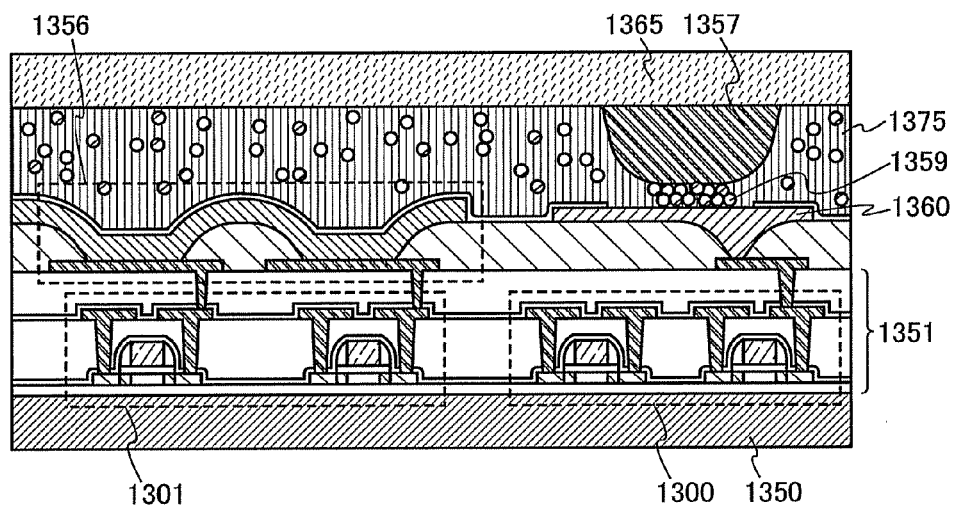

FIG. 13B illustrates an example of a semiconductor device in which an active matrix memory device is provided. The semiconductor device includes the layer 1351 having the plurality of transistors 1300 and 1301, the memory element portion 1356 formed above the layer 1351 having the plurality of transistors, a terminal portion connected to the transistors, and the substrate 1365 over which a conductive layer 1357 functioning as an antenna is formed, which are formed over the substrate 1350; and the conductive layer 1357 and the conductive layer 1360 to be a connection terminal are electrically connected to each other by the conductive particles 1359 contained in the resin 1375. Note that the substrate 1350 including the layer 1351 having the plurality of transistors, the memory element portion 1356, and the like and the substrate 1365 provided with the conductive layer 1357 functioning as an antenna are attached to each other by the resin 1375 having an adhesive property.

Alternatively, the substrate 1350 including the layer 1351 having the plurality of transistors, the memory element portion 1356, and the like and the substrate 1365 provided with the conductive layer 1357 functioning as an antenna may be connected to each other using a conductive adhesive agent such as a silver paste, a copper paste, and a carbon paste or a solder joint method. Note that a case where the memory element portion 1356 is provided above the layer 1351 having the plurality of transistors is described here; however, the present invention is not limited to this structure. The memory element portion 1356 may be provided below or in the same layer as the layer 1351 having the plurality of transistors.

Moreover, a separation layer is provided over the substrate; the layer 1351 having the plurality of transistors and the memory element portion 1352 or the memory element portion 1356 are formed over the separation layer; and the layer 1351 having the plurality of transistors, the memory element portion 1352 or 1356 are separated as appropriate using the separation method described in Embodiment 3 and may be attached to a substrate which is different from the above substrate with use of an adhesive layer.

Further, each of the memory element portions 1352 and 1356 may be provided over the substrate 1365 on which the conductive layer 1357 functioning as an antenna is provided. In other words, a first substrate, over which a layer having a plurality of transistors is formed, and a second substrate, over which a memory element portion and a conductive layer functioning as an antenna are formed, may be attached to each other with use of a resin containing conductive particles.

Regarding the semiconductor device described in this embodiment, data can not only be written once but also be written additionally. Since data once written to a memory element cannot be erased, it is possible to prevent forgery by rewriting. Further, since the semiconductor device includes a memory element which can be easily manufactured with high yield, a semiconductor device with excellent performance and reliability can be manufactured inexpensively.

Note that this embodiment can be combined with any of the other embodiments as appropriate. For example, the memory element included in the semiconductor device described in this embodiment can have a structure in which an insulating layer or a semiconductor layer is provided between the first conductor and the second conductor having a memory layer.

Embodiment 5

Figure 14A:
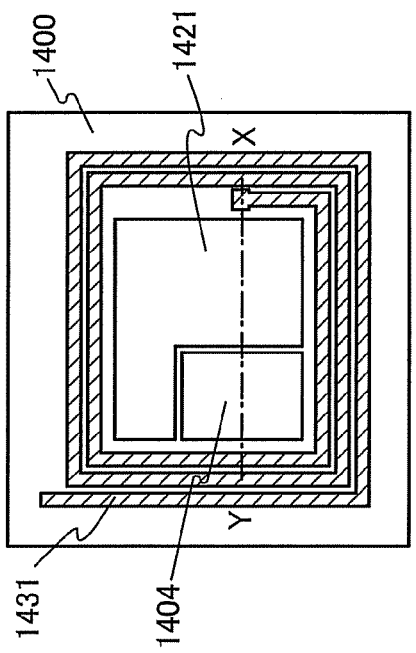
FIGS. 14A and 14B are views illustrating a semiconductor device.
Figure 14B:
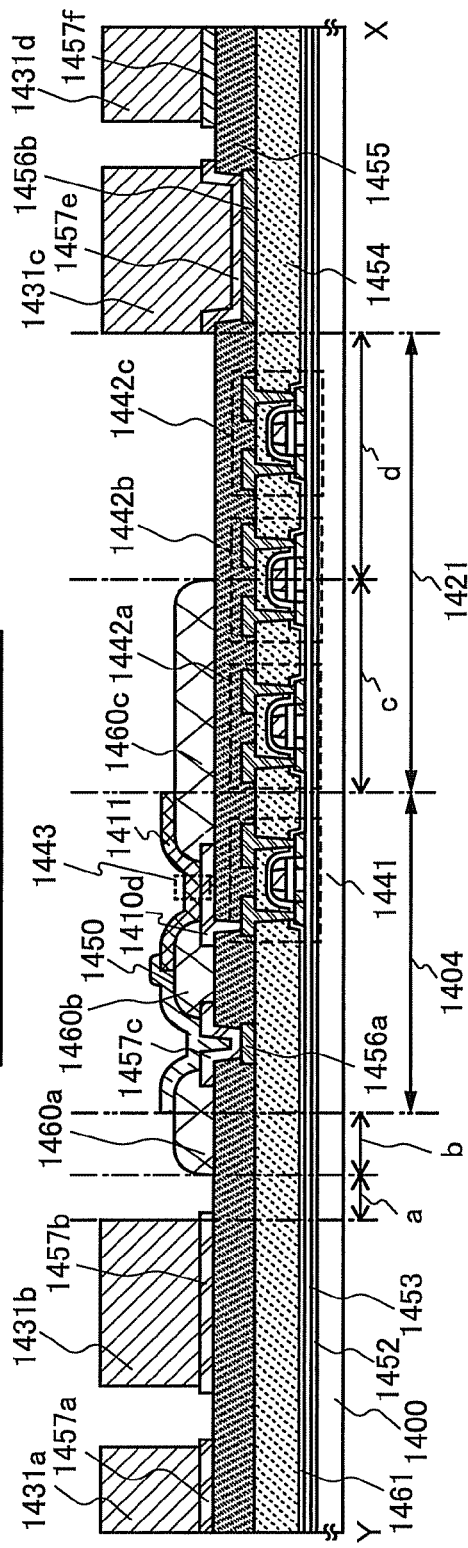
Figure 15A:
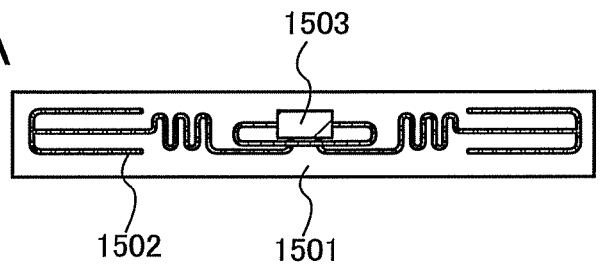
FIGS. 15A to 15D are views illustrating a chip-like semiconductor device.
Figure 15B:
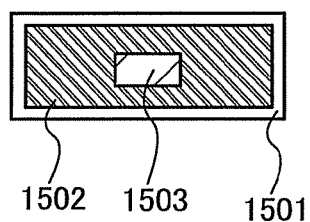
Figure 15C:
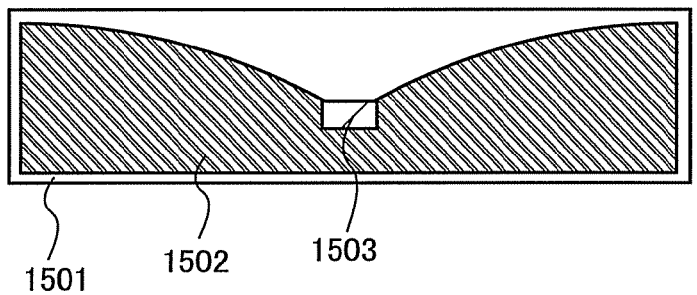
Figure 15D:
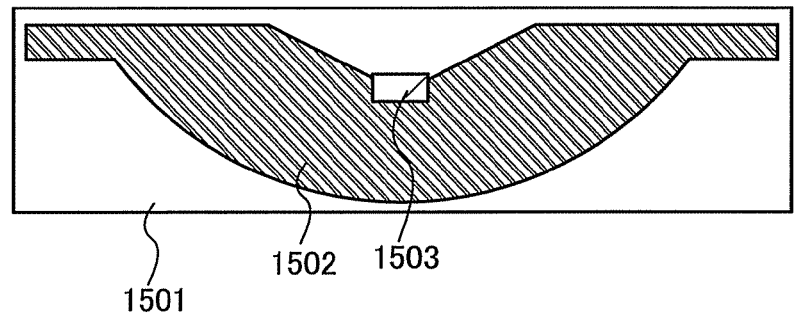

In this embodiment, an example of a semiconductor device having a memory element will be described with reference to drawings. FIG. 14A is a top view of a semiconductor device of this embodiment and FIG. 14B is a cross-sectional view taken along the line X-Y in FIG. 14A.

As illustrated in FIG. 14A, a memory element portion 1404 having a memory element, a circuit portion 1421, and an antenna 1431 are formed over a substrate 1400. FIGS. 14A and 14B illustrate a state midway through a manufacturing process in which a memory element portion 1404, a circuit portion 1421, and an antenna 1431 are formed over the substrate 1400 which can withstand manufacturing conditions. The material and manufacturing process may be selected as appropriate in a manner similar to the above embodiments in order to manufacture them.

Over the substrate 1400, a transistor 1441 is provided in the memory element portion 1404 and transistors 1442a, 1442b, and 1442c are provided in the circuit portion 1421, with a peeling layer 1452 and an insulating layer 1453 interposed therebetween. Insulating layers 1461, 1454, and 1455 are formed over the transistors 1441 and the transistors 1442a, 1442b, and 1442c, and a memory element 1443 is formed over the insulating layer 1455.

The memory element 1443 has a first conductor 1410d provided over the insulating layer 1455 and a second conductor 1411 having a memory layer. Note that the memory element 1443 can be formed using a material or method which are similar to those of the memory element described in any of the above embodiments. Although omitted in FIGS. 14A and 14B, a plurality of memory elements 1443 are separated from each other by insulating layers 1460b functioning as partition walls, or the like.

The first conductor 1410d is connected to a wiring layer of the transistor 1441. On the other hand, the second conductor 1411 is connected to a conductive layer 1457c stacked over a wiring layer 1456a through a wiring 1450. In addition, a conductive layer and the antenna 1431 illustrated in FIG. 14A are stacked and provided over the insulating layer 1455. In FIG. 14B, the conductive layer corresponds to conductive layers 1457a, 1457b, 1457e, and 1457f, and the conductive layers 1457a, 1457b, and 1457f are stacked with antennas 1431a, 1431b, and 1431d, respectively. Note that the conductive layer 1457e and an antenna 1431c are formed in an opening reaching a wiring layer 1456b formed in the insulating layer 1455, and the conductive layer 1457e and the wiring layer 1456b are connected to each other. In such a manner, the antennas are electrically connected to the memory element portion 1404 and the circuit portion 1421. Moreover, the conductive layer 1457a, the conductive layer 1457b, the conductive layer 1457e, and the conductive layer 1457f formed under the antenna 1431a, the antenna 1431b, the antenna 1431c, and the antenna 1431d, respectively, each have an effect of improving the adhesiveness between the insulating layer 1455 and the antenna. In this embodiment, a polyimide film is used for the insulating layer 1455, a titanium film is used for the conductive layers 1457a, 1457b, 1457e, and 1457f, and an aluminum film is used for the antennas 1431a, 1431b, 1431c, and 1431d.

Openings (also referred to as "contact holes") are formed in the insulating layer 1455 so that the first conductor 1410d and the transistor 1441, the conductive layer 1457c and the wiring layer 1456a, and the conductive layer 1457e and the wiring layer 1456b are connected to each other. Since resistance is decreased as the contact area between conductive materials are increased by enlargement of the opening, the openings are set in this embodiment so that the opening for connecting the first conductor 1410d to the transistor 1441 is the smallest, followed by the opening for connecting the conductive layer 1457c to the wiring layer 1456a, and the opening for connecting the conductive layer 1457e to the wiring layer 1456b is the largest. In this embodiment, the opening for connecting the first conductor 1410d to the transistor 1441 is 5 μm×5 μm, the opening for connecting the conductive layer 1457c to the wiring layer 1456a is 50 μm×50 μm, and the opening for connecting the conductive layer 1457e to the wiring layer 1456b is 500 μm×500 μm.

In this embodiment, a distance a from an insulating layer 1460a to the antenna 1431b is greater than or equal to 500 μm, distance b from the end portion of the wiring 1450 connected to the second conductor 1411 to the end portion of the insulating layer 1460a is greater than or equal to 250 μm, distance c from the end portion of the second conductor 1411 to an end portion of an insulating layer 1460c is greater than or equal to 500 μm, and distance d from the end portion of the insulating layer 1460c to the antenna 1431c is greater than or equal to 250 μm. Note that the insulating layer 1460c is formed partially in the circuit portion 1421; thus, one part of each of the transistors 1442a, 1442b, and 1442c is covered with the insulating layer 1460c and the other part thereof is not covered with the insulating layer 1460c.

With the use of such a semiconductor device, power supply voltage or a signal is directly inputted to the memory element portion 1404 from an external input portion so that data (corresponding to information) can be written to the memory element portion 1404 or read from the memory element portion 1404.

Moreover, the antenna may be provided either so as to overlap the memory element portion or so as to surround the memory element portion without the memory element portion being overlapped. In the case where the antenna overlaps the memory element portion, it may overlap the memory element portion either entirely or partially. For example, a structure where an antenna and a memory element portion overlap with each other can reduce defective operation of a semiconductor device caused by noise superposed on a signal when communication is performed by the antenna, or fluctuation or the like of electromotive force generated by electromagnetic induction.

As a signal transmission system in the above semiconductor device capable of wirelessly transmitting and receiving data, an electromagnetic coupling system, an electromagnetic induction system, a microwave system, or the like can be used. The transmission system can be selected as appropriate in consideration of an intended use, and an antenna which is suitable for the transmission system may be provided.

FIGS. 15A to 15D each illustrates an example of a chip-like semiconductor device including a conductive layer 1502 functioning as an antenna and a memory element portion 1503 which are formed over a substrate 1501. Note that an integrated circuit or the like in addition to the memory element may be mounted on the semiconductor device.

In the case where a microwave system (e.g., an UHF band (a 860 to 960 MHz band), a 2.45 GHz band, or the like) is applied as the signal transmission system in the semiconductor device, the shape such as the length of the conductive layer functioning as an antenna may be set as appropriate in consideration of the wavelength of an electromagnetic wave used for signal transmission. For example, the conductive layer functioning as an antenna can be formed in a linear shape (e.g., a dipole antenna (see FIG. 15A)), a flat shape (for example, a patch antenna (see FIG. 15B)), a ribbon shape (see FIGS. 15C and 15D), or the like. The shape of the conductive layer functioning as an antenna is not limited to the form of a line; however, the conductive layer functioning as an antenna may also be provided in the form of a curve, a meander, or a combination of them, in consideration of the wavelength of the electromagnetic wave.

In addition, in the case where an electromagnetic coupling system or an electromagnetic induction system (e.g., a 13.56 MHz band) is applied as the signal transmission system in the semiconductor device, electromagnetic induction caused by change in magnetic field density is utilized; therefore, a conductive layer functioning as an antenna is preferably formed in an annular shape (e.g., a loop antenna) or a spiral shape (e.g., a spiral antenna).

Further, even in the case where an electromagnetic coupling system or an electromagnetic induction system is applied and a semiconductor device having an antenna is provided in contact with metal, a magnetic material having magnetic permeability is preferably provided between the semiconductor device and the metal. In the case where a semiconductor device having an antenna is provided in contact with metal, eddy current flows through the metal in accordance with change in magnetic field, and a demagnetizing field generated by the eddy current impairs the change in magnetic field to reduce the communication distance. Therefore, by a material having magnetic permeability being provided between the semiconductor device and the metal, eddy current of the metal can be suppressed; thus, reduction in communication distance can be suppressed. Note that ferrite or a metal thin film having high magnetic permeability and little loss of high frequency wave can be used as the magnetic material.

Moreover, in the case of providing an antenna, a semiconductor element such as a transistor and a conductive layer functioning as an antenna may be directly formed on one substrate, or alternatively, a semiconductor element and a conductive layer functioning as an antenna may be separately provided over different substrates and then attached to each other to be electrically connected to each other.

Regarding the semiconductor device described in this embodiment, data can not only be written once but also be written additionally. Since data once written to a memory element cannot be erased, it is possible to prevent forgery by rewriting. Further, since the semiconductor device includes a memory element which can be easily manufactured with high yield, a semiconductor device with excellent performance and reliability can be manufactured inexpensively.

Note that this embodiment can be combined with any of the other embodiments as appropriate. For example, the memory element included in the semiconductor device described in this embodiment can have a structure in which an insulating layer or a semiconductor layer is provided between the first conductor and the second conductor having the memory layer.

Embodiment 6

Figure 16A:
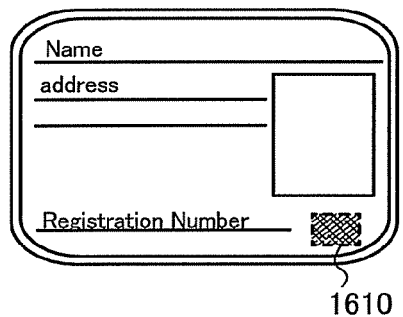
FIGS. 16A to 16F are views each illustrating an article on which a semiconductor device is mounted.
Figure 16B:
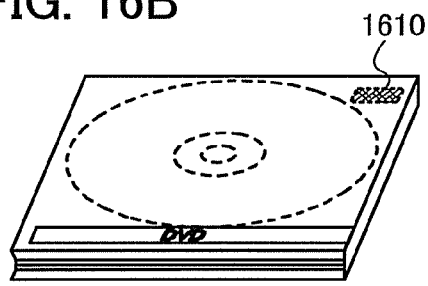
Figure 16C:
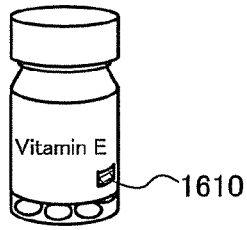
Figure 16D:
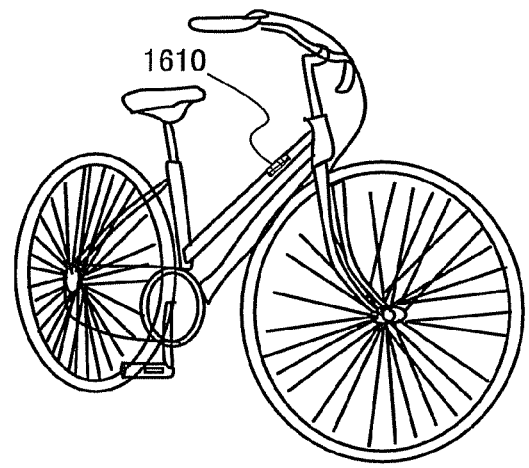
Figure 16E:
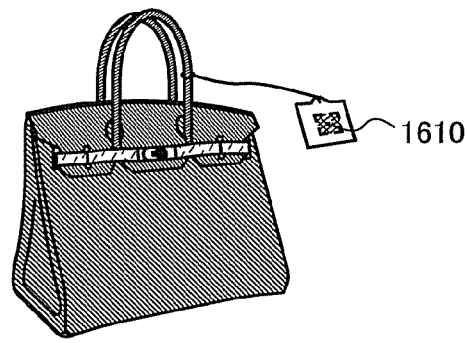
Figure 16F:
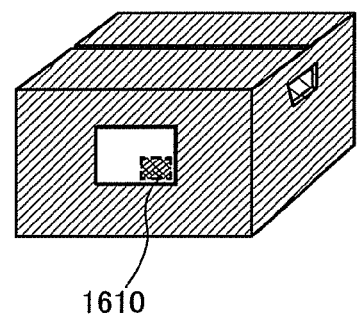

The semiconductor device described in any of the above embodiments can function as a wireless chip. A wireless chip can be used broadly, and may be used by being mounted in articles such as bills, coins, securities, bearer bonds, certificates (driver's licenses, resident cards, and the like, see FIG. 16A), packaging containers (wrapping paper, bottles, and the like, see FIG. 16C), recording media (DVDs, video tapes, and the like, see FIG. 16B), vehicles (bicycles and the like, see FIG. 16D), personal belongings (bags, glasses, and the like), food, plants, animals, human bodies, clothes, consumer products, and articles such as electronic devices, or shipping tags of baggage (see FIGS. 16E and 16F). The electronic devices include, in its category, a liquid crystal display device, an EL display device, a television device (also simply referred to as a TV, a TV receiving machine, or a television receiving machine), a cellular phone, and the like.

A semiconductor device 1610 has the above memory element and is fixed to an article by being mounted on a printed circuit board, attached on a surface, embedded in the article, or the like. For example, if the article is a book, the device is fixed to the book by being embedded in the device inside paper, and if the article is a package made of an organic resin, the device is fixed to the package by being embedded in the device inside the organic resin. Since the semiconductor device 1610 can be compact, thin, and lightweight, it does not degrade the quality of design even after the device is fixed to an article. The semiconductor device 1610 is provided for bank notes, coins, documents of value, bearer bonds, identification certificates, and the like, whereby an authentication function can be provided. With use of this authentication function, forgery can be prevented. In addition, the semiconductor device 1610 is applied to packaging containers, storage media, personal belongings, food, clothes, consumer products, electronic devices, and the like, whereby efficiency of a system such as an inspection system can be increased. Moreover, those in which forgery is prevented and system efficiency is increased can be realized more inexpensively.

Figure 17:
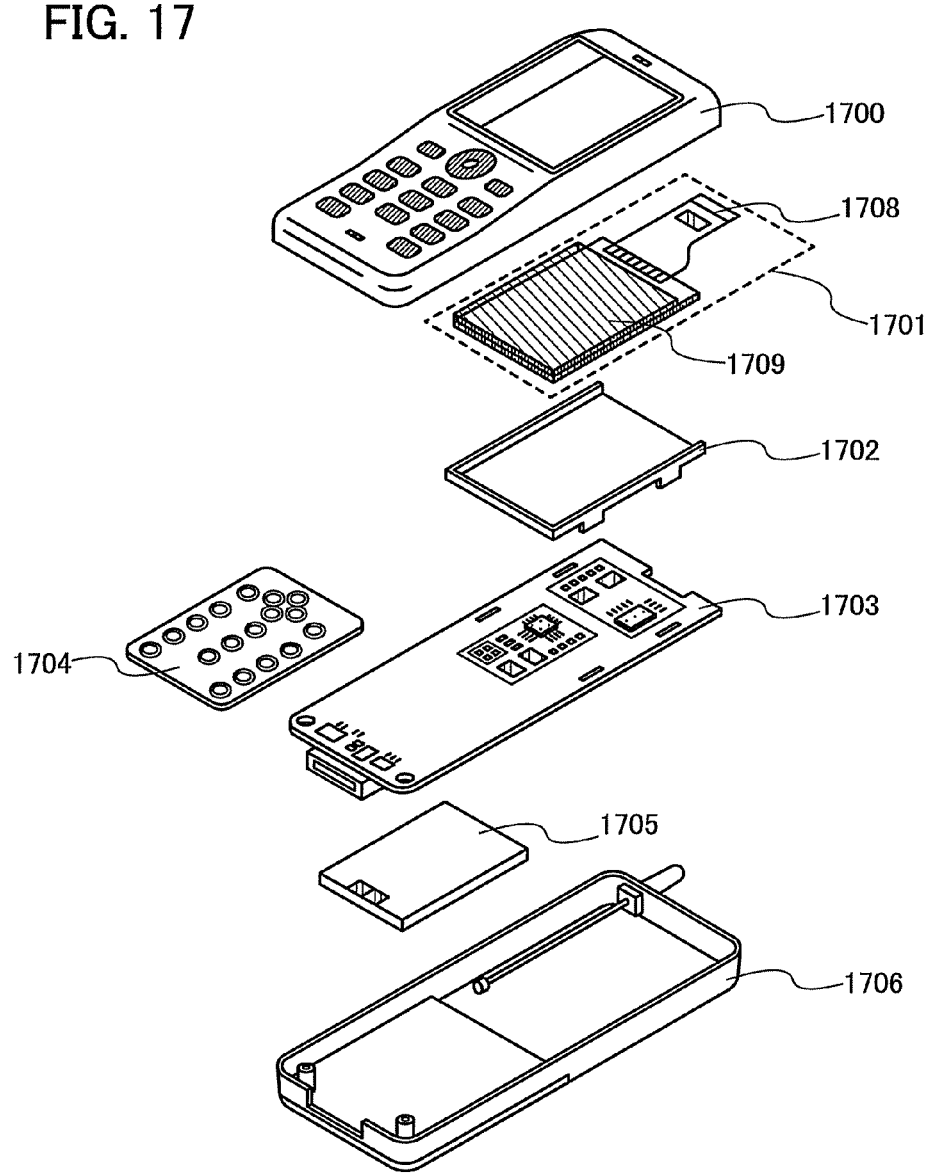
FIG. 17 is a view illustrating a cellular phone on which a semiconductor device is mounted.

Next, one mode of the electronic device on which the semiconductor device described in the above embodiment is mounted will be described with reference to FIG. 17. The electronic device exemplified here is a cellular phone, which includes housing 1700 and 1706, a panel 1701, a housing 1702, a printed wiring board 1703, operation buttons 1704, and a battery 1705. The panel 1701 is incorporated in the housing 1702 to be detachable, and the housing 1702 is fitted to the printed wiring board 1703. As for the housing 1702, the shape and size thereof are appropriately changed depending on an electronic device in which the panel 1701 is incorporated. A plurality of semiconductor devices which are packaged are mounted on the printed wiring board 1703, and as one of the semiconductor devices, the semiconductor device described in the above embodiment can be used. A plurality of semiconductor devices mounted on the printed wiring board 1703 have any function of a controller, a central processing unit (CPU), a memory, a power supply circuit, an audio processing circuit, a transmitter/receiver circuit, or the like.

The panel 1701 is connected to the printed wiring board 1703 through a connection film 1708. The panel 1701, the housing 1702, and the printed wiring board 1703 are stored in the housings 1700 and 1706 with the operation buttons 1704 and the battery 1705. A pixel region 1709 included in the panel 1701 is disposed so as to be visually recognized by an opening window provided in the housing 1700.

Since the semiconductor device described in the above embodiment is compact, thin, and lightweight, limited spaces in the housing 1700 and 1706 of the electronic device can be utilized effectively. Note that the housing 1700 and 1706 are shown as one example of an appearance shape of a cellular phone, and the electronic device according to this embodiment can be changed to various modes in accordance with a function or an application thereof.

Note that a memory element included in the semiconductor device has a first conductor and a second conductor having a memory layer. The second conductor having a memory layer can be formed in such a manner that a solvent included in a conductive paste applied onto the first conductor is vaporized. Therefore, a manufacturing process can be simplified, and thus the memory element can be manufactured inexpensively. In addition, a conductive paste is applied by a droplet discharge method such as an ink jet method or a printing method such as a screen printing method, whereby material use efficiency can be increased. Accordingly, the memory element can be manufactured more inexpensively.

Regarding the semiconductor device including such a memory element, data can not only be written once but also be written additionally. Since data once written to a memory element cannot be erased, it is possible to prevent forgery by rewriting. Accordingly, a semiconductor device with excellent performance and reliability can be manufactured inexpensively.

Note that this embodiment can be combined with any of the other embodiments as appropriate. For example, the memory element included in the semiconductor device described in this embodiment can have a structure in which an insulating layer or a semiconductor layer is provided between the first conductor and the second conductor having a memory layer.

Example 1

In this example, the memory element described in Embodiment 1 was manufactured, a solvent included in a conductive paste was vaporized with temperature conditions changed, and results of measurement of memory characteristics are shown. Note that a conductive paste (AGEP-201X) manufactured by Sumitomo Electric Industries, Ltd was used as the conductive paste. Further, in the conductive paste, silver is used as conductive particles, an epoxy resin is used as a resin, and butylcarbitol acetate is used as a solvent.

A method for manufacturing the memory element will be described below. First, a first conductor with a size of 10 mm×10 mm was formed over a glass substrate by a sputtering method. Subsequently, a conductive paste was applied onto the first conductor. After that, the solvent was vaporized under predetermined temperature conditions. Accordingly, the memory element was manufactured. The temperature conditions were changed by change of substrate temperatures. Note that the first conductor was formed using titanium.

Subsequently, the memory characteristics of the manufactured memory element were measured. A manual prover was connected to the first conductor and a second conductor having a memory layer and current flowing between the first conductor and the second conductor was measured while voltage was swept from low level to high level.

Figure 18:
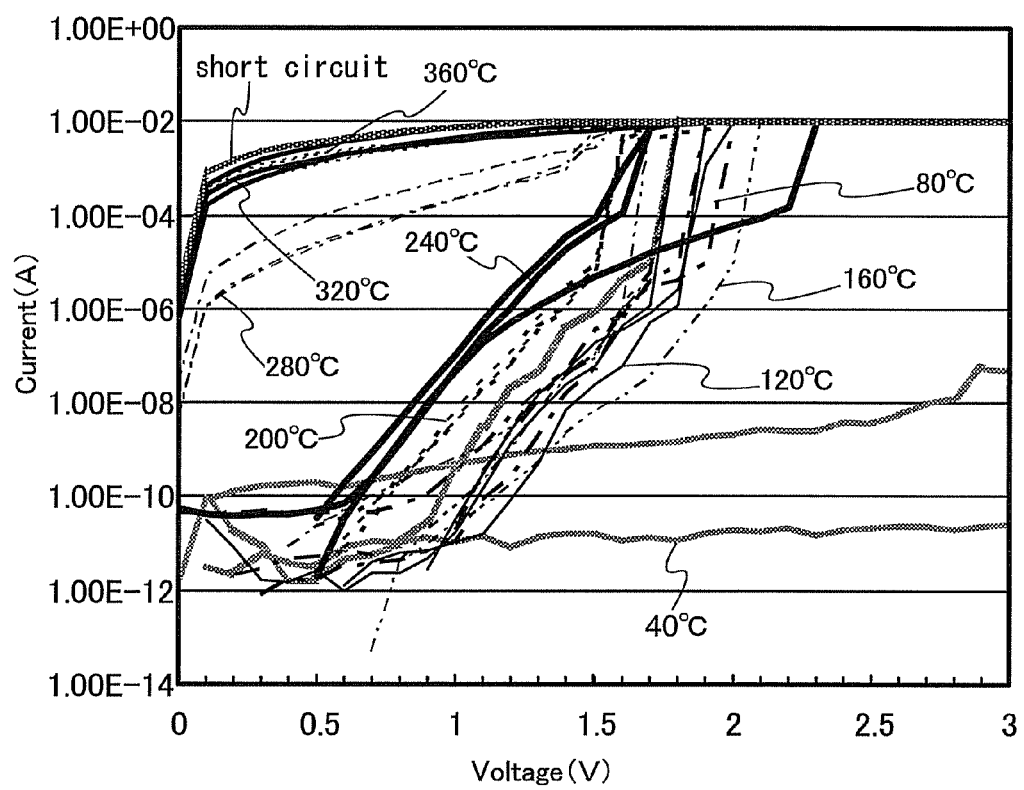
FIG. 18 is a graph showing voltage-current characteristics of a memory element (Example 1)

The results are shown in FIG. 18. In FIG. 18, the data indicated by "short circuit" means data of an element in which the first conductor and the second conductor had been short-circuited since before application of voltage and the data with temperatures means data of elements in each of which the solvent of the conductive paste was vaporized at the temperature.

According to FIG. 18, the elements in which the solvents included in the conductive pastes were vaporized at 320° C. and 360° C. showed the same characteristic as the element in which the first conductor and the second conductor had been short-circuited since before application of voltage. In other words, those elements were found to be difficult to use as a memory element. It is considered that this is because heating was performed at a temperature exceeding the upper temperature limit of the conductive paste.

The current values of the elements in which the solvents of the conductive pastes were vaporized at temperatures ranging from 80° C. to 280° C. were highly changed depending on applied voltage. In other words, it was found that the first conductor and the second conductor were short-circuited at a certain voltage or higher. Therefore, the elements in which the solvents of the conductive pastes were vaporized at temperatures ranging from 80° C. to 280° C. were found to be able to use as an antifuse-type memory element. Note that, although the element in which the solvent of the conductive paste was vaporized at 40° C. was not short-circuited within the voltage range shown in FIG. 18, it was short-circuited at a voltage lower than approximately 7.5 V and found to be able to operate as an antifuse-type memory element. Needless to say, the conductivity of the second conductor in a direction parallel to the substrate was enough for the second conductor to withstand being used as a conductor.

Further, it was also found that as for the element in which the solvent of the conductive paste was vaporized at a room temperature (about 25° C.), similarly, the second conductor could be used as a conductor having a memory layer if three to seven days are taken for vaporization.

Note that, clear change in the resistance value was seen particularly in the elements in which the solvents included in the conductive pastes were vaporized at temperatures ranging from 80° C. to 240° C. Therefore, it can be said that those elements have more favorable characteristics as a memory element.

Example 2

In this example, cross-sectional photographs of a memory element having a structure similar to that in Example 1 will be shown. In other words, the memory element is manufactured using titanium for a first conductor 110 and a conductive paste (AGEP-201X) manufactured by Sumitomo Electric Industries, Ltd for a second conductor having a memory layer.

Figure 19A:
FIGS. 19A and 19B are photographs each showing a cross section of a memory element (Example 2)
Figure 19B:

FIG. 19A is a cross-sectional photograph of a memory element in which a solvent included in the conductive paste was vaporized at 200° C. FIG. 19B is a cross-sectional photograph of a memory element in which a solvent included in the conductive paste was vaporized at 300° C.

According to the photograph, in the memory element in which the solvent was vaporized at 200° C., a thin layer of a resin 104 remains between the first conductor 110 and conductive particles 103. The layer of the resin 104 plays a role as a memory layer, whereby the memory element functions as a memory element. On the other hand, in the element in which the solvent was vaporized at 300° C. (FIG. 19B), a layer of a resin does not remain between the first conductor 110 and the conductive particles 103, and the first conductor 110 is in contact with the conductive particles 103; therefore, it is difficult for the element to function as a memory element.

As described above, depending on the temperature at which the solvent included in the conductive paste is vaporized, conditions between the first conductor and the conductive particles in the conductive paste are changed. Therefore, it was found that an element which can be used as a memory element and an element which is difficult to use as a memory element are manufactured depending on the temperature at which the solvent included in the conductive paste is vaporized.

Note that in FIGS. 19A and 19B, a portion denoted by a reference numeral 113 is a titanium oxide film which is the first conductor.

Figure 20A:
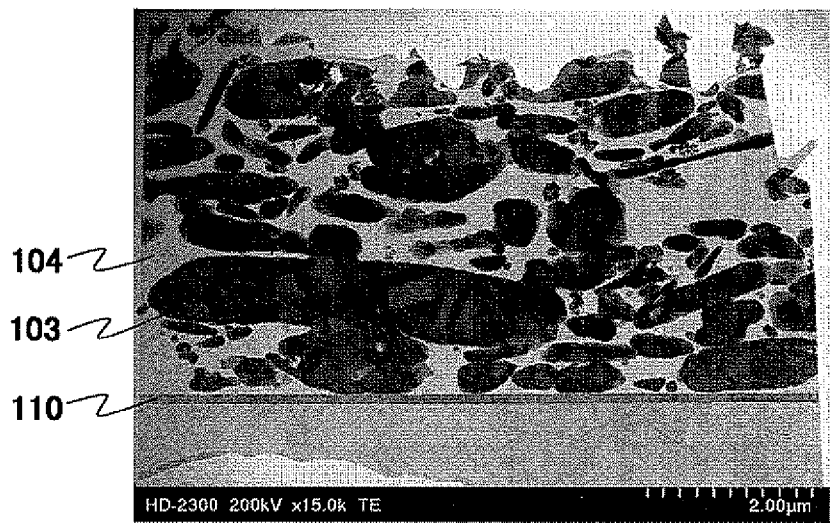
FIGS. 20A and 20B are photographs each showing a cross section of a memory element (Example 2).

Note that FIG. 20A is a cross-sectional photograph showing the memory element in which the solvent included in the conductive paste was vaporized at 200° C. with different magnification. The fact that the conductive particles 103 are in contact with each other to form a path through which current flows indicates that electrical connection in a direction parallel to a substrate is performed without any problem.

Figure 20B:
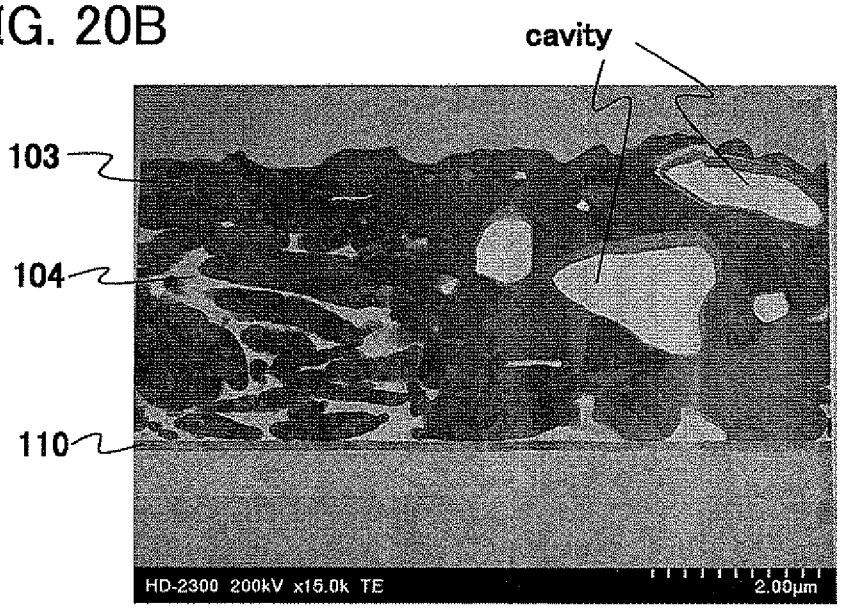

In addition, FIG. 20B is a cross-sectional photograph of the memory element in which the solvent included in the conductive paste was vaporized at 300° C. According to the photograph, although the conductive particles are in contact with each other as in FIG. 20A, large cavities are formed. These large cavities are considered to be caused by applied heat higher than the upper temperature limit of a resin, such as outgassing from the resin.

This application is based on Japanese Patent Application serial no. 2008-161257 filed with Japan Patent Office on Jun. 20, 2008, the entire contents of which are hereby incorporated by reference.

What is claimed is:

1. A method for manufacturing a memory element, comprising the steps of:
   forming a first conductor;
   forming a semiconductor layer over the first conductor;
   placing a conductive paste over the semiconductor layer, the conductive paste comprising conductive particles, a resin, and a solvent; and
   vaporizing the solvent to form a second conductor, the second conductor comprising the conductive particles and a memory layer including the resin between the first conductor and the conductive particles.

2. The method for manufacturing a memory element according to claim 1,
   wherein the conductive paste is placed by a droplet discharge method or a printing method.

3. The method for manufacturing a memory element according to claim 1,
   wherein the solvent is vaporized at a temperature higher than or equal to 10° C. and less than or equal to 280° C.

4. The method for manufacturing a memory element according to claim 1,
   wherein the conductive particles are silver particles.

5. The method for manufacturing a memory element according to claim 1,
   wherein the resin is a phenol resin, an epoxy resin, a polyester resin, a silicone resin, an urea resin, an acrylic resin or a cellulose resin.

6. The method for manufacturing a memory element according to claim 1, wherein the semiconductor layer is an inorganic semiconductor layer.

7. The method for manufacturing a memory element according to claim 1, wherein each of the conductive particles has a size of greater than or equal to 0.1 μm and less than or equal to 10 μm.

8. The method for manufacturing a memory element according to claim 1, wherein a proportion of the conductive particles in the conductive paste is from 80 wt % to 95 wt %.

9. A method for manufacturing a memory element, comprising the steps of:
   forming a first conductor;
   forming a semiconductor layer over the first conductor;
   placing a conductive paste so as to be in contact with a portion of the semiconductor layer, the conductive paste comprising conductive particles, a resin, and a solvent; and
   vaporizing the solvent to form a second conductor so as to overlap with the portion of the first conductor, the second conductor comprising the conductive particles and a memory layer including the resin between the first conductor and the conductive particles.

10. The method for manufacturing a memory element according to claim 9,
    wherein the conductive paste is placed by a droplet discharge method or a printing method.

11. The method for manufacturing a memory element according to claim 9,
    wherein the solvent is vaporized at a temperature higher than or equal to 10° C. and less than or equal to 280° C.

12. The method for manufacturing a memory element according to claim 9,
    wherein the conductive particles are silver particles.

13. The method for manufacturing a memory element according to claim 9,
    wherein the resin is a phenol resin, an epoxy resin, a polyester resin, a silicone resin, an urea resin, an acrylic resin or a cellulose resin.

14. The method for manufacturing a memory element according to claim 9, wherein each of the conductive particles has a size of greater than or equal to 0.1 μm and less than or equal to 10 μm.

15. The method for manufacturing a memory element according to claim 9, wherein a proportion of the conductive particles in the conductive paste is from 80 wt % to 95 wt %.

* * * * *